(12) United States Patent
Maraschin et al.

(10) Patent No.: US 9,881,826 B2
(45) Date of Patent: Jan. 30, 2018

(54) BUFFER STATION WITH SINGLE EXIT-FLOW DIRECTION

(71) Applicant: Lam Research Corporation, Fremont, CA (US)

(72) Inventors: Martin Robert Maraschin, Pleasanton, CA (US); Richard Howard Gould, Fremont, CA (US); Derek John Witkowicki, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 40 days.

(21) Appl. No.: 14/523,122

(22) Filed: Oct. 24, 2014

(65) Prior Publication Data

US 2016/0118282 A1    Apr. 28, 2016

(51) Int. Cl.
*H01L 21/67* (2006.01)
*H01L 21/677* (2006.01)
*H01L 21/673* (2006.01)

(52) U.S. Cl.
CPC .. *H01L 21/67769* (2013.01); *H01L 21/67393* (2013.01)

(58) Field of Classification Search
CPC .............. H01L 21/67769; H01L 21/67393
USPC ......................................... 414/217; 206/711
See application file for complete search history.

(56) References Cited

U.S. PATENT DOCUMENTS

| 4,745,088 | A | * | 5/1988 | Inoue | C23C 16/4584 |
| | | | | | 117/101 |
| 5,346,518 | A | * | 9/1994 | Baseman | B65G 1/00 |
| | | | | | 206/204 |
| 6,729,823 | B2 | * | 5/2004 | Sakata | H01L 21/67017 |
| | | | | | 414/217 |
| 6,899,145 | B2 | * | 5/2005 | Aggarwal | H01L 21/67393 |
| | | | | | 141/11 |
| 8,245,663 | B2 | * | 8/2012 | Fazio | H01L 21/67748 |
| | | | | | 118/723 E |
| 8,293,016 | B2 | * | 10/2012 | Bahng | H01L 21/02071 |
| | | | | | 118/725 |
| 2005/0169730 | A1 | * | 8/2005 | Aggarwal | H01L 21/67126 |
| | | | | | 414/217 |
| 2015/0030416 | A1 | | 1/2015 | Sakiya et al. | |

FOREIGN PATENT DOCUMENTS

KR    1020130059574    7/2013

* cited by examiner

*Primary Examiner* — Patrick J Maestri
(74) *Attorney, Agent, or Firm* — Weaver Austin Villeneuve & Sampson LLP

(57) ABSTRACT

A buffer for use in semiconductor processing tools is disclosed. The buffer may be used to temporarily store wafers after processing operations are performed on those wafers. The buffer may include two side walls and a back wall interposed between the side walls. The side walls and the back wall may generally define an area within which the wafers may be stored in a stacked arrangement. Wafer support fins extending from the side walls and the back wall may extend into a wafer support region that overlaps with the edges of the wafers. Purge gas may be introduced in between each pair of wafers via purge gas ports located in one of the walls.

20 Claims, 18 Drawing Sheets

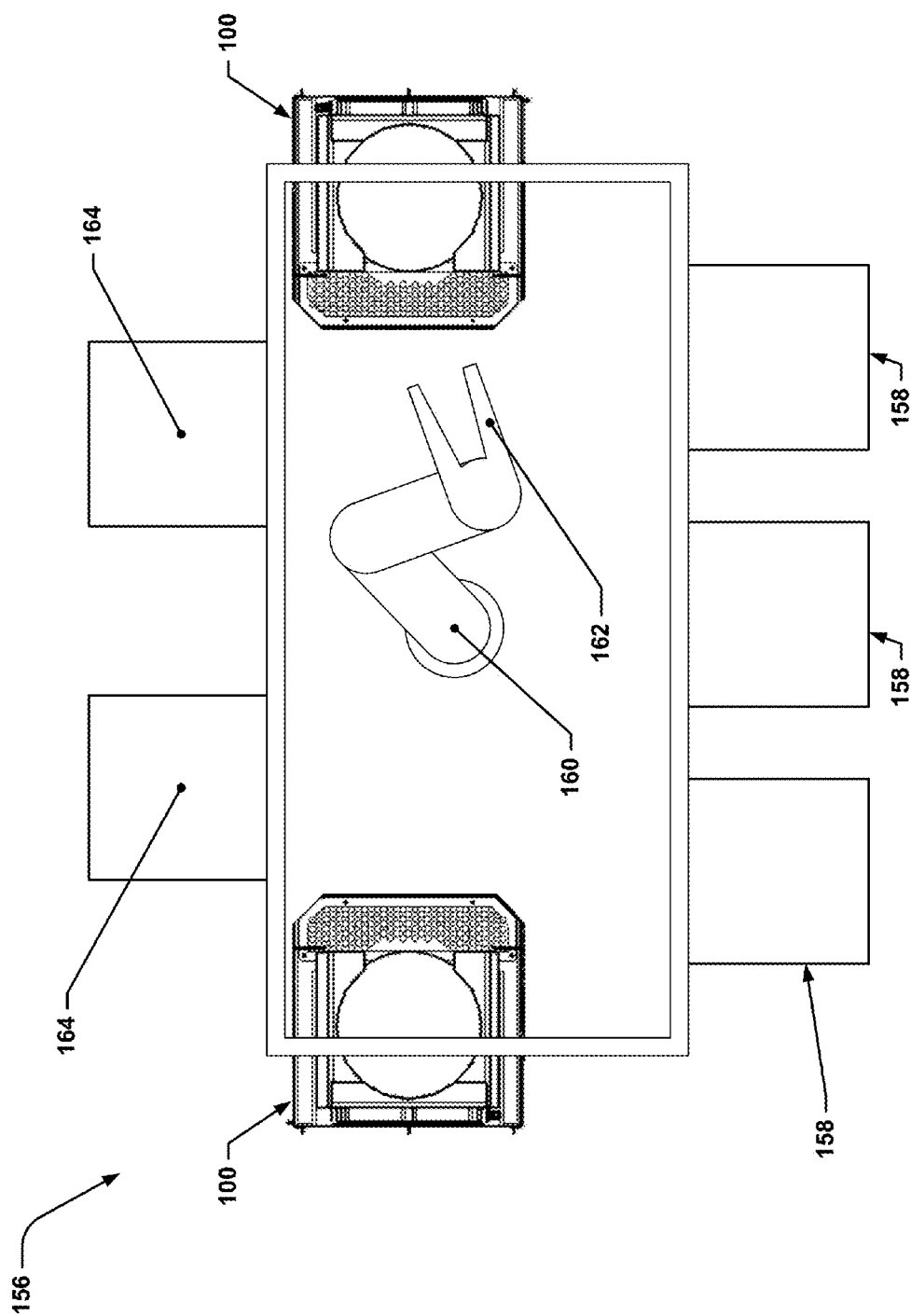

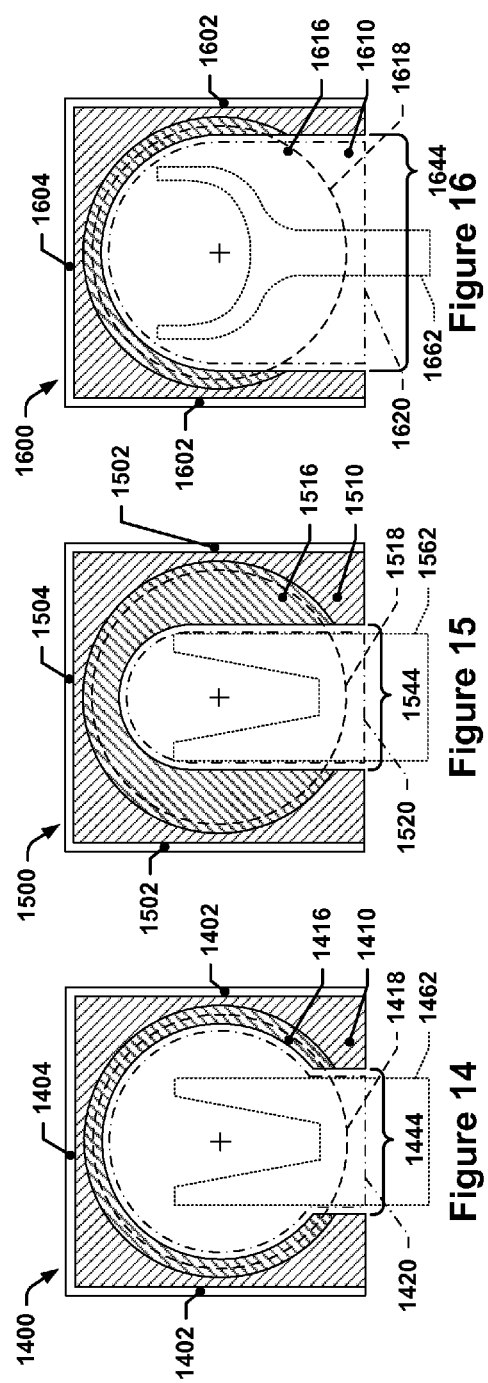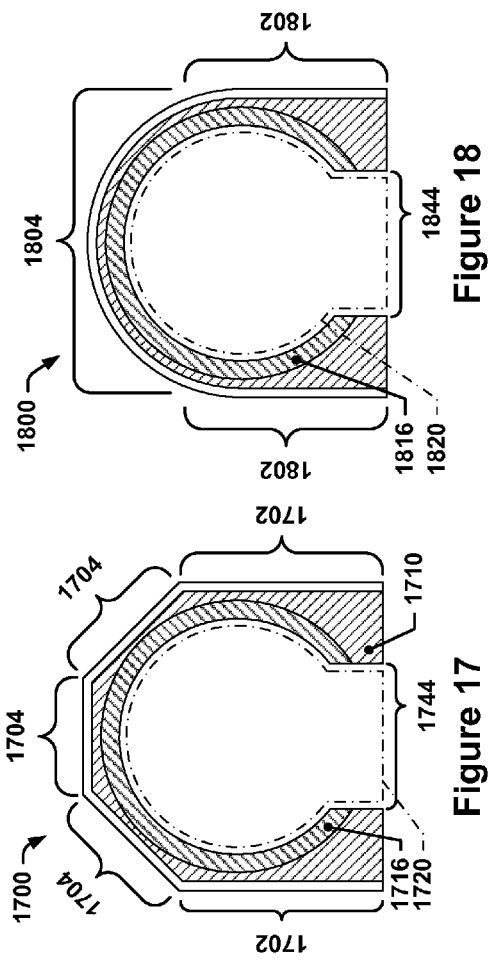

BUFFER STATION WITH SINGLE EXIT-FLOW DIRECTION

BACKGROUND

Semiconductor processing operations are often performed in a semiconductor processing tool, which may feature several semiconductor processing chambers or reactors that are connected to a transfer chamber of some sort; the transfer chamber and the semiconductor processing chambers are typically connected together in a hermetically-sealed manner and kept under vacuum conditions. Wafers are typically provided to, and removed from, the transfer chamber via loadlocks.

The loadlocks are typically connected to an Equipment Front End Module (EFEM), which is usually a structure with a wafer handling robot inside that is configured to move wafers between the load locks and a number of other structures within, or attached to, the EFEM. The internal environment of the EFEM is typically referred to as a "mini-environment"; filtered, dry air is typically constantly flowed through the mini-environment (it is not practical to keep the EFEM at a vacuum, which is why loadlocks are used as a barometric interface between the EFEM and the transfer chamber). Wafers are typically supplied to the EFEM using cassettes of vertically-stacked wafers (e.g., 25 or 30 wafers) called Front-Opening Unified Pods (FOUPs); the robot in the EFEM may pick a wafer from a FOUP and transfer it to the loadlock, or may transfer processed wafers into a FOUP.

Industry standard processes typically mandate that a FOUP contain only unprocessed (and thus clean) wafers or contain only processed (and potentially dirty) wafers—mixing unprocessed and processed wafers in a single FOUP is considered undesirable and is against industry standard practices. Moreover, wafers are often quite hot after they exit processing, and it may be undesirable to put hot wafers into the FOUPs until they are cooled down. To that end, an EFEM will often include a buffer or buffer station that may be used to temporarily store in-process wafers before they are transferred to the processed wafer FOUP. Buffers typically hold a large number, e.g., 25 or 30, wafers in a vertically-stacked arrangement.

Since the wafers that are stored in a buffer have usually undergone recent semiconductor processing operations, they often have chemical residuals from the processing operations on their exposed surfaces. Moisture and oxygen in the mini-environment of the EFEM may react with such chemical residues, causing damage to the processed wafers and can also damage the components of the buffer or EFEM near the wafers.

One technique for mitigating such chemical reactions is to use a buffer such as is described in KR 1020140059574, published Jul. 6, 2013. Such a buffer includes two opposing, vertical stacks of plates that are at least a wafer diameter apart. Small, short ledges extend from alternating instances of such plates and provide a small support area on which each wafer may rest. These ledges extend around only a short distance of the wafer perimeter on opposing sides of the wafer, e.g., around about $\frac{1}{8}^{th}$ of the wafer circumference on each opposing side. A series of vertical gas delivery tubes extends upwards through each plate instance, and nozzles in each tube are used to direct purge gas out of slots in alternating instances of the plates and towards the mid-plane of the wafers. The purge gas in this case flows towards the middle of the wafers as well as towards the front and the back of the wafer.

SUMMARY

The systems, methods and devices of the disclosure each have several innovative aspects, no single one of which is solely responsible for the desirable attributes disclosed herein. One innovative aspect of the subject matter described in this disclosure can be implemented in a variety of ways.

In some implementations, a buffer for storing multiple wafers in a semiconductor manufacturing tool is provided. The buffer may include two opposing side walls, a back wall, and a plurality of support fins. The two opposing side walls and the back wall may define part of an interior buffer volume which may have an opening opposite the back wall; the opposing side walls may be between the opening and the back wall. Each support fin may extend from the back wall, along both side walls, and to the opening. Each support fin may also be substantially flat and horizontal when the buffer is in use and have a wafer support region that is smaller in diameter than the wafers with which the buffer is designed to be used. The support fins may also extend from the side walls and the back wall in a substantially unbroken manner up to at least the wafer support region, and may have a cutout region that extends from the opening past the center of the wafer support region and that is wide enough in a direction transverse to the opening to allow an end effector of a wafer handling robot to place a wafer on the support fin.

In some implementations, each support fin may be offset from the adjacent support fin or support fins and the support fins form a vertical linear array when the buffer is in use.

In some implementations, the buffer may also include a ceiling and a floor. The interior buffer volume may be further defined by the ceiling and the floor and the back wall and the two sidewalls may be between the ceiling and the floor.

In some such implementations, the opposing side walls, the back wall, the ceiling, and the floor may seal the interior buffer volume off from the surrounding environment, and the opening may be the only substantial flow path out of the interior buffer volume.

In some implementations, each support fin may overlap over 50% of the outer perimeter of one of the wafers when the wafer is in the wafer support region and supported by the support fin. In some further implementations, each support fin may overlap over 75% of the outer perimeter of one of the wafers when the wafer is in the wafer support region and supported by the support fin.

In some implementations, the wafer support region may lie within an annular area with an outer diameter larger than the wafer diameter and an inner diameter within 1" of the wafer diameter.

In some implementations, the wafer support region of each support fin may be provided by a recessed area in a surface of the support fin that faces upwards when the buffer is in use and the recessed area of each support fin may be recessed to a depth that causes a wafer supported by the support region to be substantially flush with the surface of the support fin that faces upwards when the buffer is in use.

In some implementations, the cutout region may have a circular portion of a larger diameter than the wafer, each support fin may have a plurality of pegs extending from a surface of the support fin facing the center of the circular portion, and the wafer support region may have an annular area that includes the pegs within its boundaries.

In some implementations, the number of support fins may 24 support fins, 25 support fins, 29 support fins, or 30 support fins, or really any number of support fins that is desired.

In some implementations, the buffer may include at least one heater platen that may be in thermally-conductive contact with at least one of the side walls or the back wall.

In some implementations, the buffer may include a plurality of purge gas ports, and there may be at least one purge gas port between each pair of adjacent support fins. In some such implementations, there may be a single purge gas port between each pair of adjacent support fins and each purge gas port may have the shape of a long, thin slot running in a direction parallel to the adjacent support fins. In some other such implementations, there may be a plurality of purge gas ports between each pair of adjacent support fins. In some such implementations, each such plurality of purge gas ports between each pair of adjacent support fins may include a linear array of regularly-spaced purge gas ports.

In some implementations, the plurality of purge gas ports may include purge gas ports located in the back wall. In some other or additional implementations, the plurality of purge gas ports may include purge gas ports located in at least one side wall.

In some implementations, the buffer may also include a plenum cover and a plenum cavity. The plenum cavity may be defined, at least in part, by the plenum cover and a surface of the back wall opposite the interior buffer volume and the plenum cavity may be in fluidic communication with the plurality of purge gas ports.

In some implementations, the buffer may also include an exhaust port and a clean air inlet. The clean air inlet may be configured to flow gas across the opening and into the exhaust port.

In some implementations, an equipment front-end module (EFEM) for a semiconductor processing tool may be provided. The EFEM may include an EFEM housing, one or more loadlocks configured to allow wafers to be transferred from the EFEM to a transfer chamber or process chamber of the semiconductor processing tool, one or more mechanical interfaces for supporting front-opening unified pods (FOUPs), a wafer transfer robot configured to transfer wafers between various stations within the EFEM, and one or more of the buffers described above.

Details of one or more implementations of the subject matter described in this specification are set forth in the accompanying drawings and the description below. Other features, aspects, and advantages will become apparent from the description, the drawings, and the claims.

DRAWINGS

FIG. 13 depicts a plan view of an EFEM with two buffers installed.

FIG. 14 depicts a top section view of an example buffer similar to the buffer shown in FIG. 1.

FIG. 15 depicts a top section view of another example buffer.

FIG. 16 depicts a top section view of yet another example buffer.

FIG. 17 depicts a top sectional view of a buffer with a hexagonal cross-section.

FIG. 18 depicts a top sectional view of a buffer with a cylindrical back wall.

Figure 19:
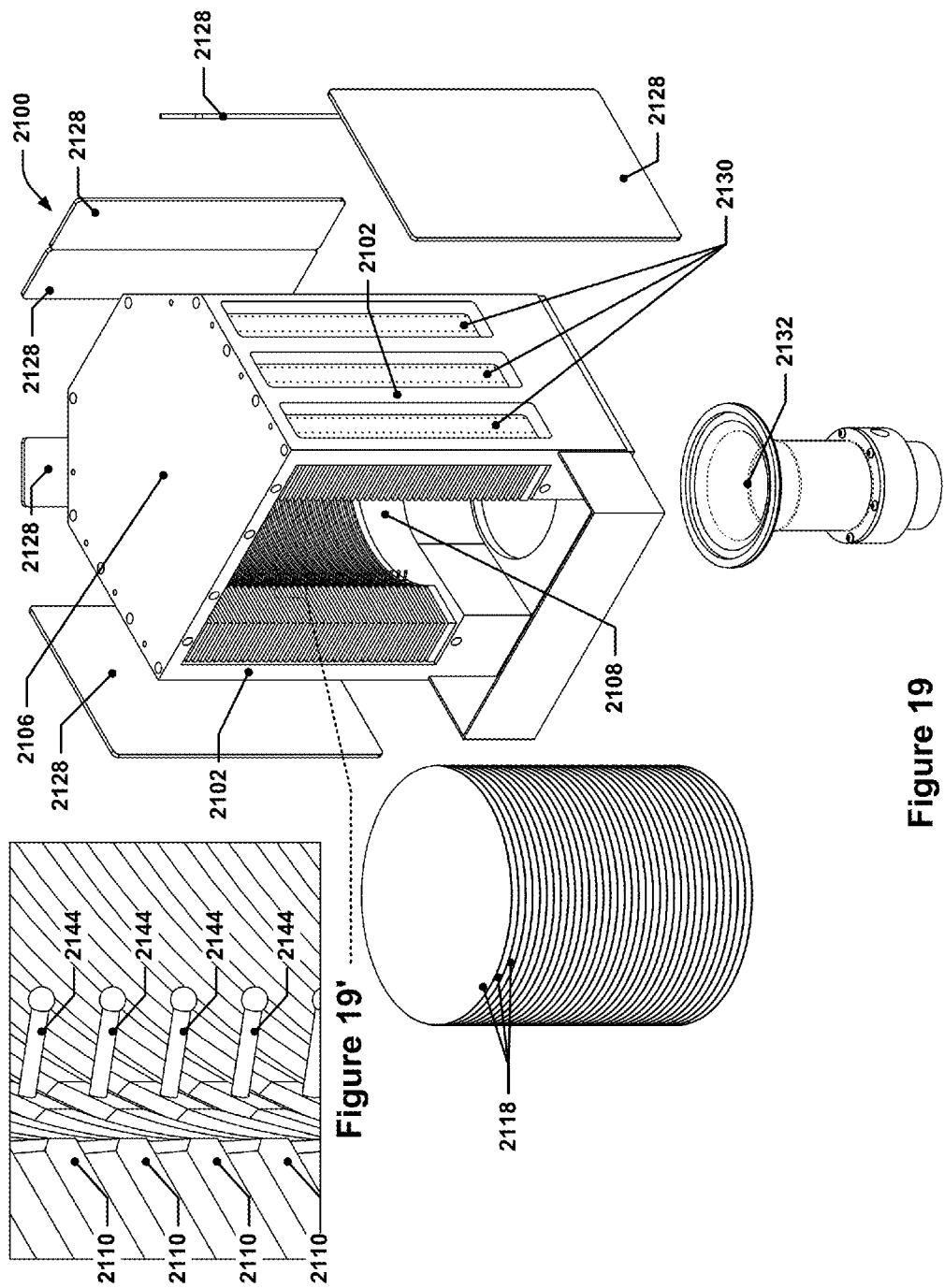
FIG. 19 depicts an exploded isometric view of another example of an implementation of a buffer.

FIG. 19' depicts a detail view of a portion of FIG. 19.

Figure 20:
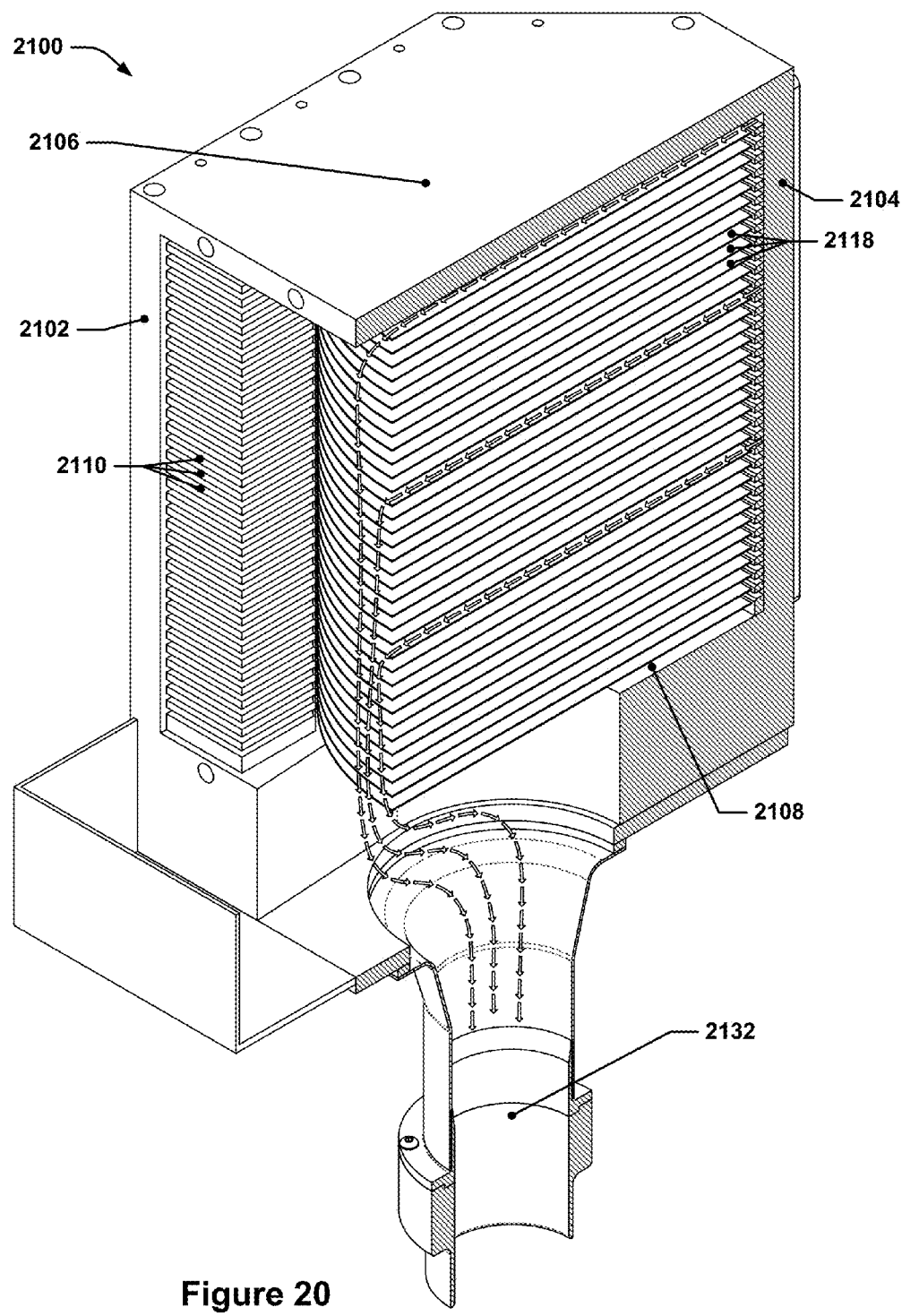

FIG. 20 depicts an isometric section view of the example buffer of FIG. 19.

Figure 21:
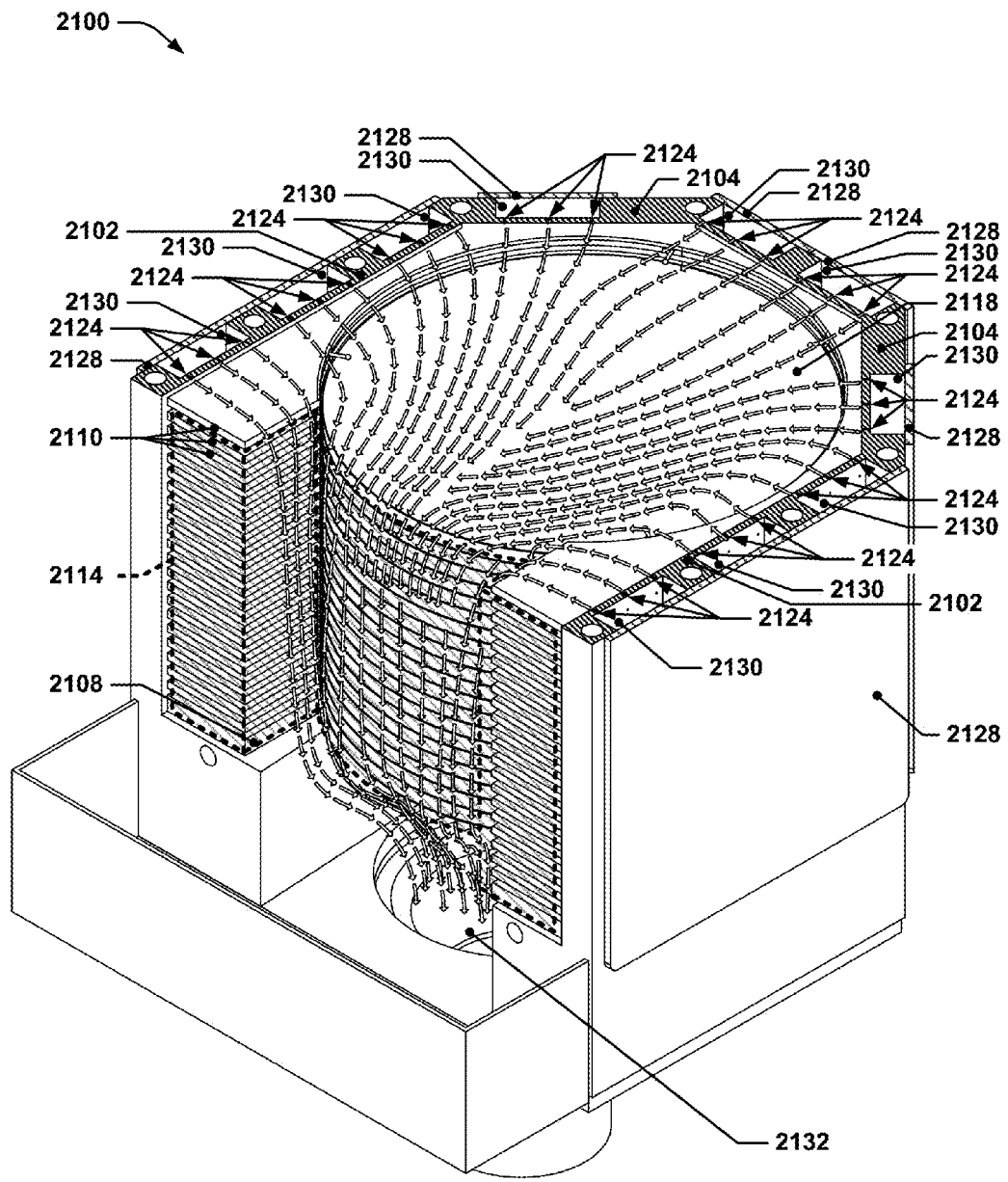

FIG. 21 depicts another isometric section view of the example buffer of FIG. 19.

Figure 22:
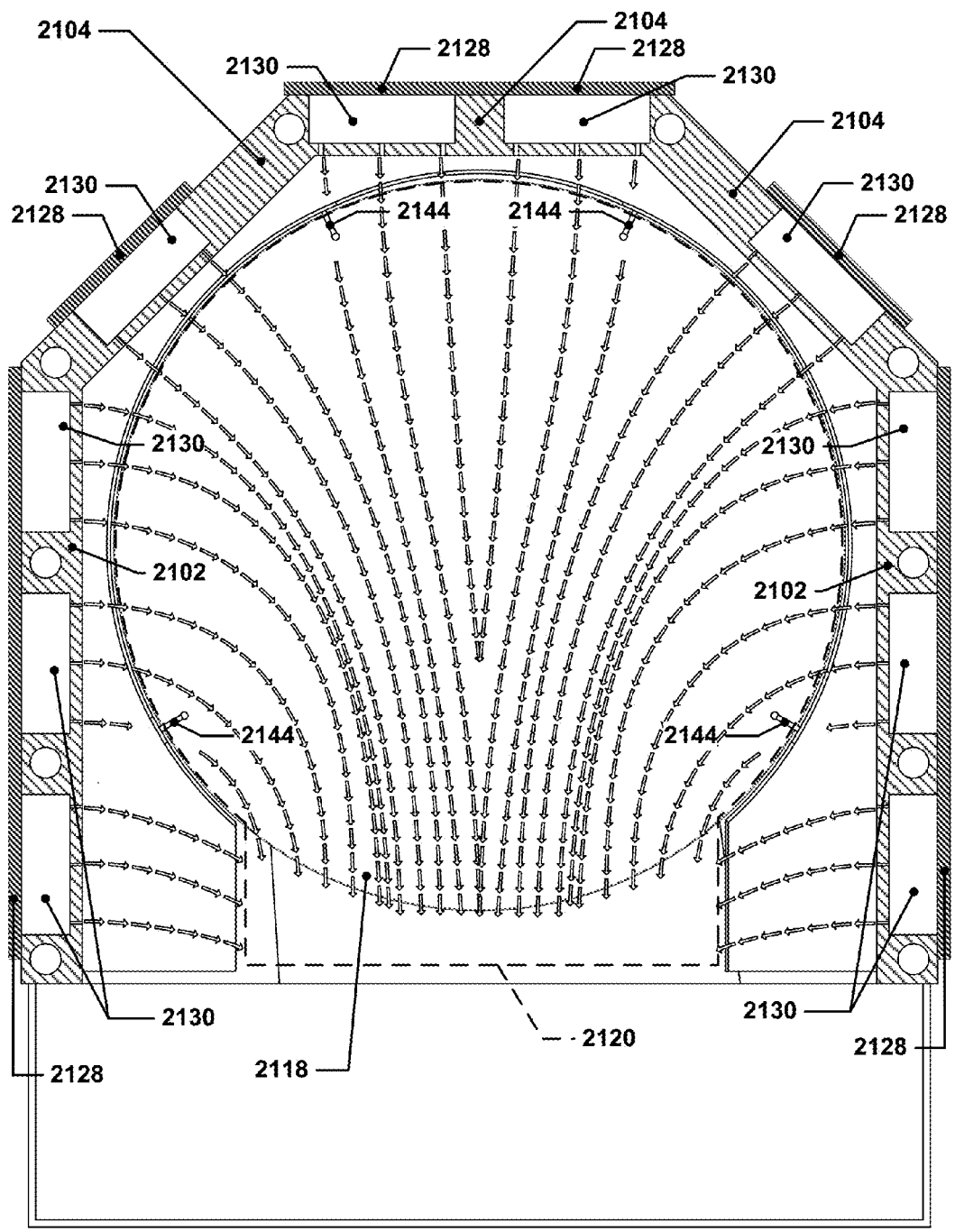

FIG. 22 depicts a top section view of the example buffer of FIG. 19.

Figure 23:
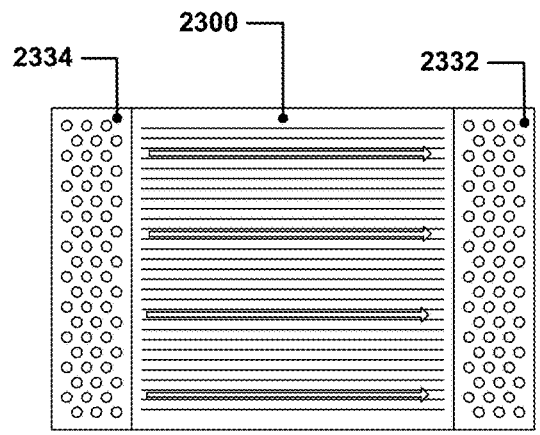

FIG. 23 depicts a front view of a buffer with a side-mounted exhaust and side-mounted filtered air inlet.

Figure 24:
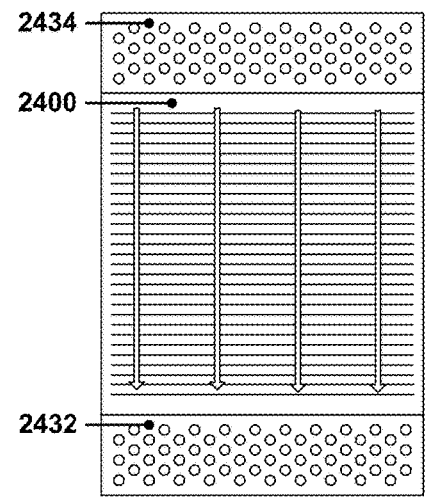

FIG. 24 depicts a front view of a buffer with bottom-mounted exhaust and a top-mounted filtered air inlet.

Figure 25:
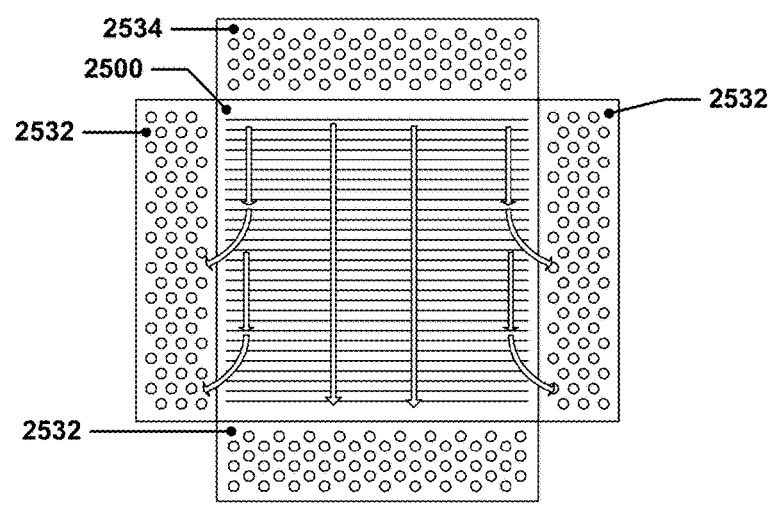

FIG. 25 depicts a front view of a buffer with top-mounted filtered air inlet and side- and bottom-mounted exhausts.

FIGS. 1 through 22 are drawn to-scale within each Figure, with the exception of the purge gas ports in some of the figures, which have been increased in diameter to allow for easier visibility.

DETAILED DESCRIPTION

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

The present inventors have realized that existing buffers may be considerably improved in a number of ways. For example, the present inventors determined that a buffer that is effectively closed off from the ambient environment except for the side of the buffer through which wafers are inserted into (and removed from) the buffer may provide a much higher purity purge gas environment as compared with traditional buffers. In traditional buffers, the front and the back surface of the buffer are typically open to the ambient environment and purge gas is directed into the gaps between the wafers stacked within the buffer from ports located on either side of the wafer. The purge gas then flows towards the middle, front, and back of the wafers and then down into some form of exhaust system, where it is scrubbed and disposed of.

The present inventors determined that due to the fact traditional buffers are largely open structures, e.g., with no back wall, wafers resting in such buffers are inevitably exposed to air from the minienvironment—even if purge gas is injected between the wafers. This is because there is always a pressure differential between the front and back sides of such a buffer, and this pressure differential causes air from the EFEM to be drawn through the wafer stack (perhaps at a slow overall rate, but drawn through nonetheless).

The present inventors determined that enclosing the buffer on at least three sides eliminates the cross-flow gas contamination issue discussed above, as there is only one significant entry/exit from the buffer from a bulk gas flow perspective.

The present inventors further determined that supporting the wafers in a manner that provides a substantially unbroken surface extending from the wafers' edges towards the side walls and the back wall of the buffer (assuming that the opening through which the wafers are inserted into or removed from the buffer is in the "front" of the buffer) may provide enhanced purge gas effectiveness by limiting interwafer purge gas flow. Such support may be provided by support fins that extend inwards towards the center of the buffer from the side walls and the back wall. The support fins may have a cutout region in the middle that allows a wafer handling robot to insert an end effector into the buffer, move the end effector in a vertical, upwards direction to lift a wafer up from below, and then retract the end effector and the wafer from the buffer. The cutout region may thus extend from the opening in the front of the buffer to a point between the nominal center of mass of the wafers and the back wall.

The support fins and wafers, when the wafers are resting on the support fins, each form an effectively continuous shelf that extends from the back wall, along the side walls, and to the front of the buffer. Without the wafers, there would be a large hole in the middle of each support fin where the cutout region is; the wafers, when present, act to cover this hole up. The support fin/wafer combination acts to limit vertical migration of gas within the buffer.

The present inventors also determined that purge gas flowed into the space above each support fin from linear arrays of purge gas ports in one or more walls of the buffer may flow across the support fin and the wafer supported by the support fin (if present). The purge gas may thus flow in a primarily horizontal direction (with respect to the Earth frame of reference) until it exits the buffer through the opening through which the wafers are introduced into the buffer. While the purge gas ports may be located in either or both of the side walls of the buffer, the present inventors determined that locating purge gas ports in the back wall of the buffer appeared to offer advantageous performance. Purge gas flowed from the back wall may generally flow directly across each wafer towards the opening, i.e., in a single, overall direction, with little risk of dead zones in which purge gas and volatiles from the wafers may collect and loiter. Generally speaking, the opening (or, more specifically, the boundary formed by the edges of the wafers and support fins closest to the opening) may be the only substantial flow path exit out of the interior buffer volume (assuming that, in cases where the floor of the buffer is open, a wafer is in the bottom-most position in the buffer) for the purge gas that is introduced into the interior buffer volume. For example, while there may be some incidental leakage of purge gas out of seams or other small gaps/holes/etc. that may be present in the buffer (e.g., in order to accommodate various features needed to assemble the buffer), such incidental gas flow is completely overshadowed by the gas flow out of the opening, e.g., on the order of three or more magnitudes less than the magnitude of gas flow through the opening. This causes the purge gas that is introduced into the gap above each wafer to flow across the wafer up to the edge of that wafer closest to the front opening of the buffer and then be drawn into an exhaust without causing air from the EFEM to be drawn into that same space.

The following discussion is directed at an example implementation of a buffer designed according to these principles. It is to be understood that other implementations may be designed differently while still practicing some or all of the concepts discussed herein, and the present disclosure is not limited to just the implementation shown.

Figure 1:
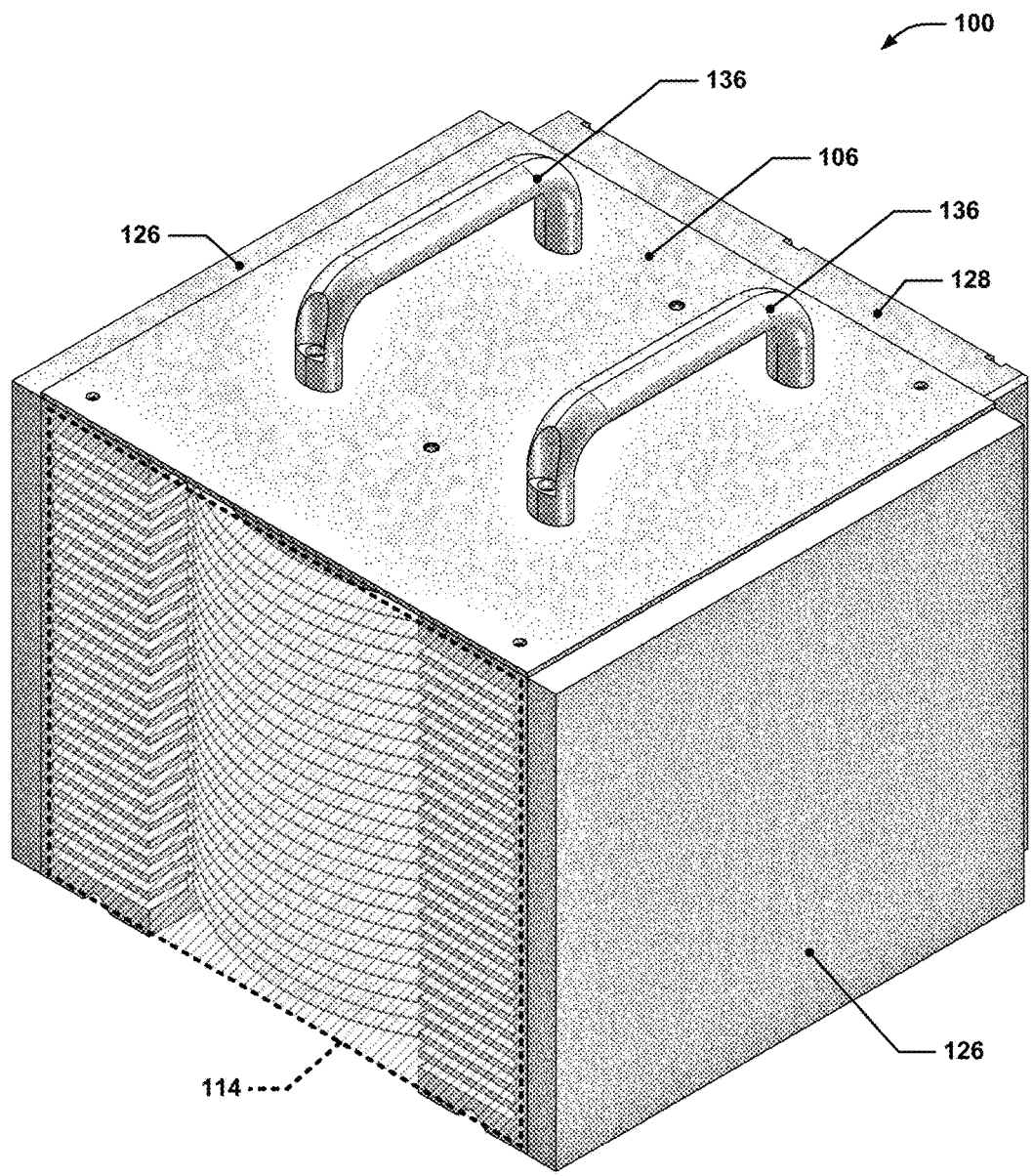
FIG. 1 depicts an isometric view of an example of a buffer with a single exit flow direction.
Figure 2:
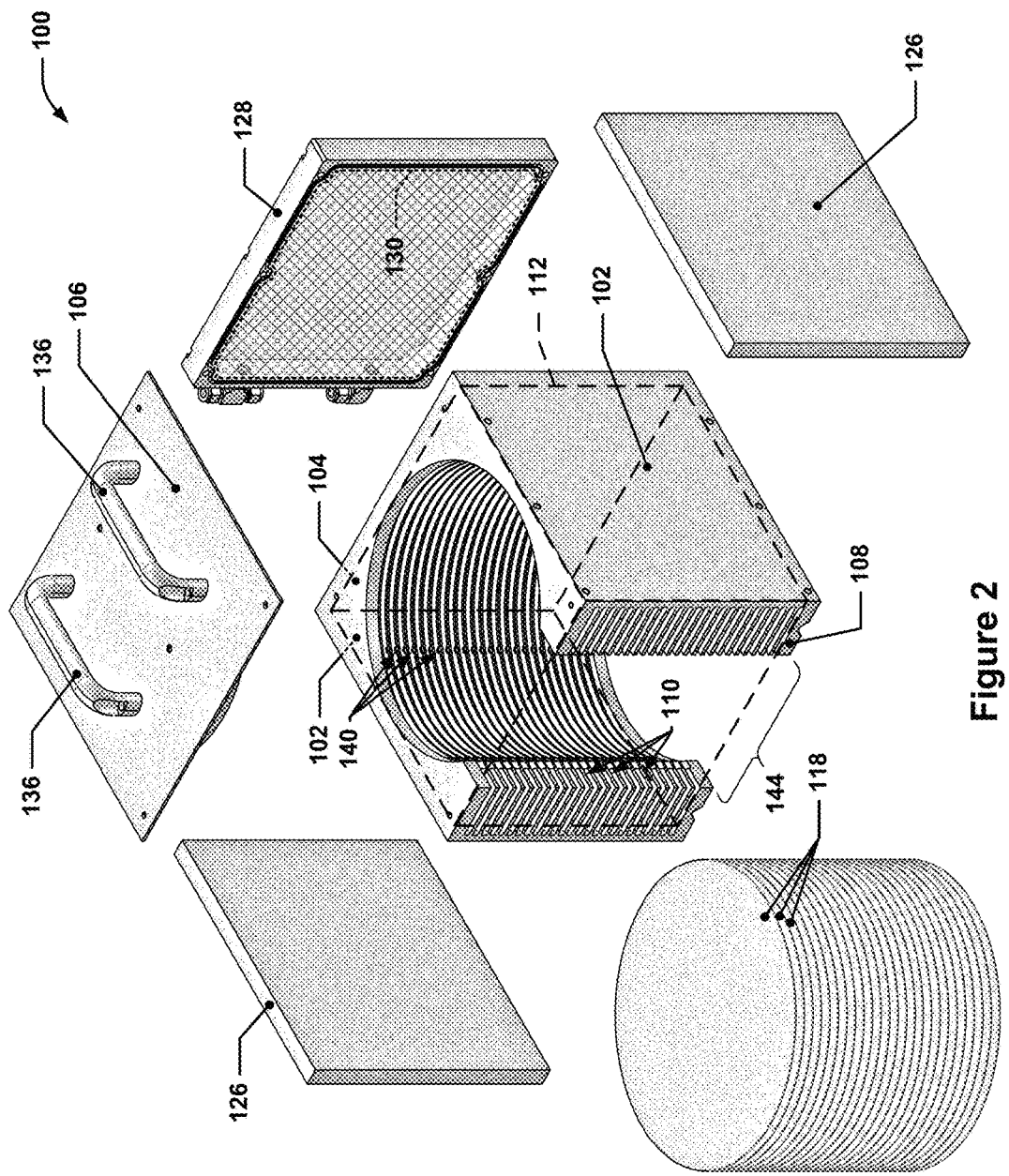
FIG. 2 depicts an isometric exploded view of the buffer of FIG. 1.

FIG. 1 depicts an isometric view of an example of a buffer with a single exit flow direction. FIG. 2 depicts an isometric exploded view of the buffer of FIG. 1.

A buffer 100 is shown in FIGS. 1 and 2. The buffer 100 has a rectangular prismatic shape, although other shapes are possible as well, including a buffer with a semicircular back wall, or a buffer with side walls that taper together between the back wall and the wafer centers (thus forming more of a hexagonal shape in the plan view). The buffer 100 has a lid or ceiling 106, which in this implementation, includes handles 136 that protrude out from the ceiling 106 and allow for easy grasping and handling of the buffer 100. A pair of heating platens 126 may be in thermally-conductive contact with side walls 102 of the buffer 100 (such heating platens may also or alternatively located in other positions, e.g., on the ceiling/lid, the floor, the back wall, etc.). The heating platens 126 may be used to heat the walls of the buffer and to help drive out any moisture that may manage to stray inside of the buffer. Some implementations may forego the inclusion of the heating platens 126 if heating is not needed.

The implementation of the buffer 100 that is shown in FIG. 1 is configured to flow gas from purge gas ports located in a back wall 104 of the buffer 100 into an interior buffer volume 112 and towards an opening 114 in the front of the buffer 100. The purge gas, in this implementation, may be distributed to the purge gas ports by way of a plenum cavity 130 that is formed between a plenum cover 128 and the back wall 104. If purge gas ports are additionally or alternatively located in the side wall(s) 102 of the buffer 100, a similar plenum structure may be used on those side walls. Such purge gas may, for example, be nitrogen or some other inert gas.

As can be seen in FIG. 2, a plurality of wafers 118 may be stored within the buffer 100. In this particular implementation, 25 wafers 118 may be stored in the buffer 100, although other implementations may store other numbers of wafers 118, e.g., 30 wafers, 35 wafers, etc. The wafers shown here are 300 mm wafers, although the concepts described herein may be adapted to provide buffers for 450 mm wafers or any other size of wafer.

Also visible in FIG. 1 are a plurality of support fins 110. Each support fin 102 has a wafer support region that is, in this implementation, C-shaped, with the inside radius of the C being smaller than one half the wafer nominal diameter, and the outside radius of the C being larger than one half the wafer nominal diameter. The wafer support region may be generally flat or planar, and may typically include three or more wafer support features 140 located at spaced-apart locations in the wafer support region. The wafer support features 140 may serve to elevate the wafer off of the wafer support region such that each wafer 118 has minimal contact with the support fin 110 that supports it. This helps reduce particulate generation/contamination. The wafer support region may, for example, lie within an annular region with an outer diameter larger than the wafer diameter and an inner diameter that is within 1" of the wafer diameter, although other implementations may have different sized wafer support regions.

In the implementation shown, there are 24 support fins 110 shown. The 25$^{th}$ wafer 118 (the bottom-most wafer 118) is supported by a wafer support region that is part of a floor 108. This last wafer support region could just as easily be provided using a 25$^{th}$ support fin 110, however.

The region within the inside radius of the C may be thought of as a cutout region with a cutout region throat 144. The cutout region throat 144 may be sized so as to be wide enough to allow an end effector of a wafer handling robot with which the buffer is to be used to be inserted into the cutout region via the cutout region throat 144. In some implementations, the cutout region and the cutout region throat 144 may be the same width, i.e., having the form of a large slot that travels towards the back wall 104 from the opening 114. The various components shown may be assembled together using any appropriate fastening techniques, e.g., threaded fasteners, clips, etc. Such assembly features are not necessarily shown in the Figures to avoid undue visual clutter.

Figure 3:
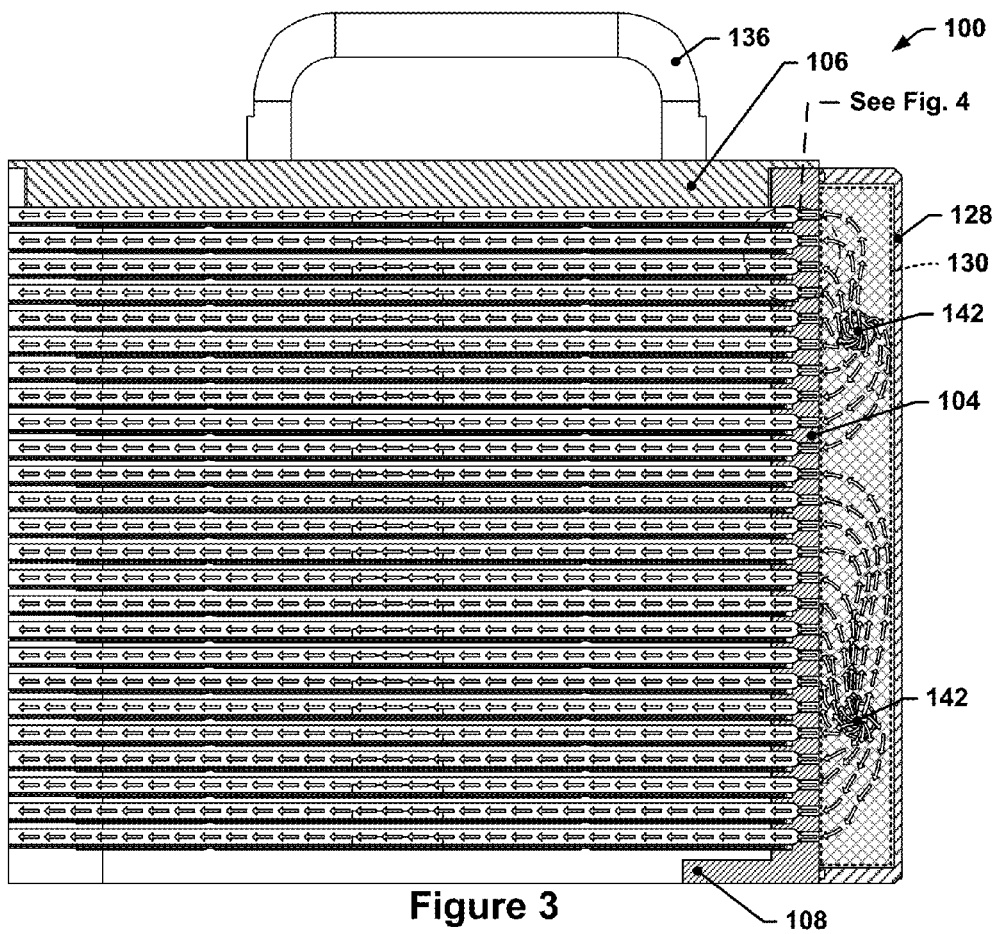
FIG. 3 depicts a side section view of the buffer of FIG. 1.
Figure 4:
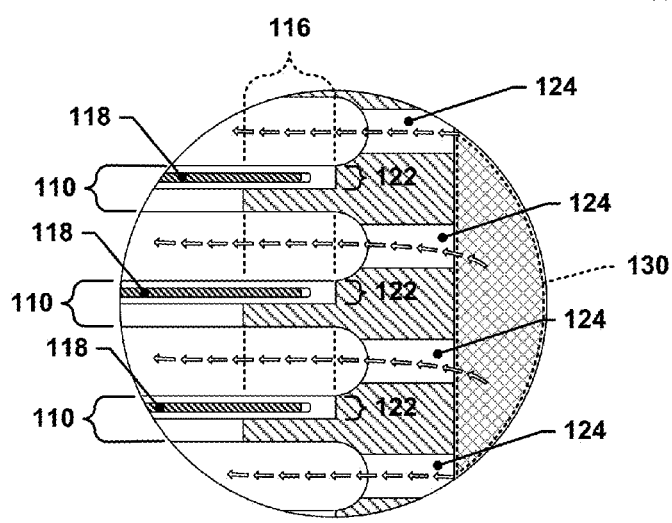
FIG. 4 depicts a detail view of a portion of FIG. 3.

FIG. 3 depicts a side section view of the buffer of FIG. 1. FIG. 4 depicts a detail view of a portion of FIG. 3. Arrows showing notional gas flow paths have been added to this view to help illustrate the flow of purge gas in the buffer 100. Purge gas may flow into the plenum cavity 130 that is formed between the plenum cover 128 and the back wall 104 from purge gas inlets 142. In this implementation, there are two purge gas inlets 142 located in a side portion of the plenum cover 128, although more or fewer such purge gas inlets 142 may be used and the location or locations of such purge gas inlets may be varied. The purge gas may flow into the plenum cavity 130 and then flow through the back wall 104 through a number of linear arrays of purge gas ports 124. Each linear array of purge gas ports 124 may flow gas into the space above one of the support fins 110 (and wafer 118, if present). Generally, the wafers 118 may be supported by sequentially adjacent support fins 110, i.e., without empty support fins 110 between the wafers, so that the bottom of each wafer 118 forms a "ceiling" for the space between the wafer 118 and the support fin 110 directly below that wafer 118. This "ceiling" helps constrain the flow of purge gas in a generally linear direction towards the opening 114. The "ceiling" for the topmost wafer 118 in the buffer 100 may be provided by the actual ceiling or lid 106.

In the support fins 110 shown, the wafer support region 116 is formed by a recessed area 122 that allows the wafer 118 to sit below the nominal upper surface of the support fin 110 instead of sitting proud of, or flush with, the upper surface. As can be seen, there is both a radial gap and an axial gap between the wafer 118 and the support fin 110. The radial gap is to accommodate radial uncertainty in wafer placement by the robot arm that handles the wafers. The axial gap is to accommodate the wafer support features 140 and to prevent the wafer 118 from actually coming into contact with the wafer support region. Purge gas may, of course, flow through these small gaps and migrate between different inter-wafer spaces, but the conductance of such gaps is completely overshadowed by the conductance of the large passage formed between the opening 114 and the back wall 104 between each pair of adjacent support fins 110. These gaps may typically be on the order of a millimeter or two or less. More specifically, the radial gap may be kept as small as the radial positioning tolerance of the robot arm reasonably permits. The axial gap may, in some implementations, be reduced to the minimum gap that still provides sufficient clearance to prevent the possibility of as small as is necessary to keep the wafer 118 from contacting the wafer support region (except at the wafer support features 140). Some implementations of the buffer may provide a wafer support region without wafer support features, allowing for large-area contact between the wafer and the wafer support region (this may provide for less gas migration through this interface due to the smaller gap size, or lack thereof, but at the expense of potentially greater contaminate production due to the increased contact area).

The buffers described herein may also be implemented without recessed areas (or with recessed areas of shallower depth) such that the wafer 118 stands at least slightly proud of the upper surface of the supporting support fin 110. Such implementations, however, may see an increase in the amount of purge gas migration between inter-wafer spaces since the flow path between the wafers 118 and the support fins 110 is less tortuous as compared with support fins 110 with recessed areas 122. In yet other implementations, the recess may be sized such that the wafer is substantially flush with the support fin top surface.

As discussed above, while the implementation shown in the accompanying Figures is designed to prevent or mitigate purge gas flow between the stacked wafers 118, there may still be some such purge gas migration, e.g., via small gaps between the wafers 118 and the wafer support regions 116. While the example buffer 100 shown in the Figures avoids including features other than the above-mentioned gaps that may allow for inter-wafer gas flow, some buffer implementations may include additional features that allow for inter-wafer gas migration. While such features are generally undesirable from the perspective of this disclosure, there may be other considerations that warrant their inclusion, e.g., visual or optical inspection considerations, assembly considerations, etc. To that end, while it is generally preferable that each support fin 110 be without perforations or gaps between the wafer support region 116 and the back wall 104 and the side walls 102, it is to be understood that implementations where there are small perforations or gaps in the support fin 110 between the wafer support region 116 and the back wall 104 and side walls 102 may also fall within the scope of this disclosure. In such additional implementations, there may still be substantially no inter-wafer purge gas flow, i.e., the amount of purge gas flow across each wafer/support fin is at least three orders of magnitude or more greater than the amount of inter-wafer purge gas flow from that wafer/support fin.

Figure 5:
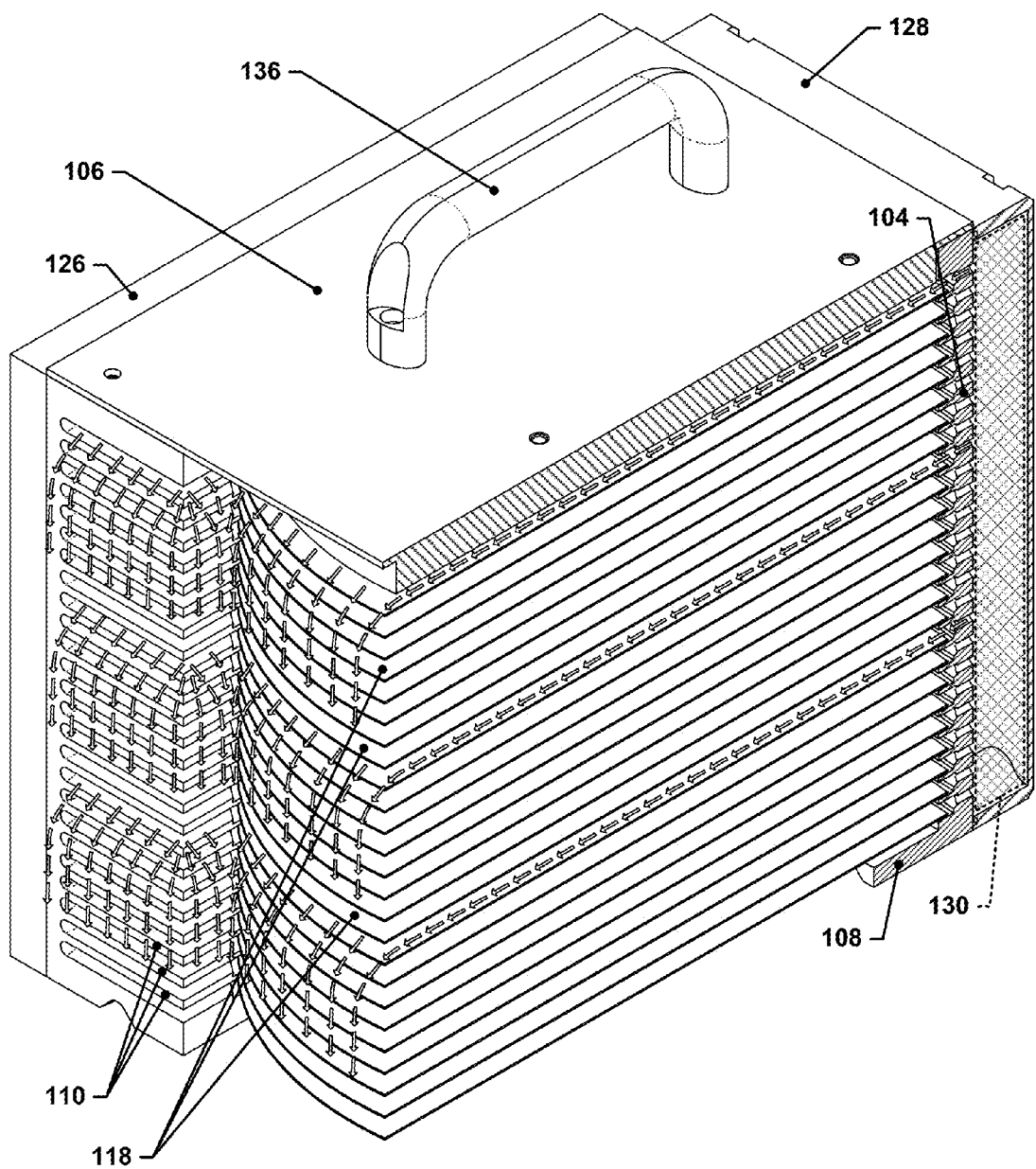
FIG. 5 depicts an isometric section view of the buffer of FIG. 1.

FIG. 5 depicts an isometric section view of the buffer of FIG. 1. Arrows have also been added to this view to show purge gas flow, although only for three of the wafer/support fin levels (to avoid undue clutter—similar gas flows, however, would occur for each wafer/support fin level). As can be seen, purge gas flows generally in a linear direction towards the opening 114. Since the edge of the "shelf" formed by each wafer 118 and its supporting support fin 110 near the opening does not form a straight line all the way across due to the cutout region throat 144, some of the purge gas may flow off of the support fin 110 or wafer 118 into the notch formed by the intersection of the wafer 118 outer edge and the edge of the support fin 110 facing the opposing side wall 102.

Figure 6:
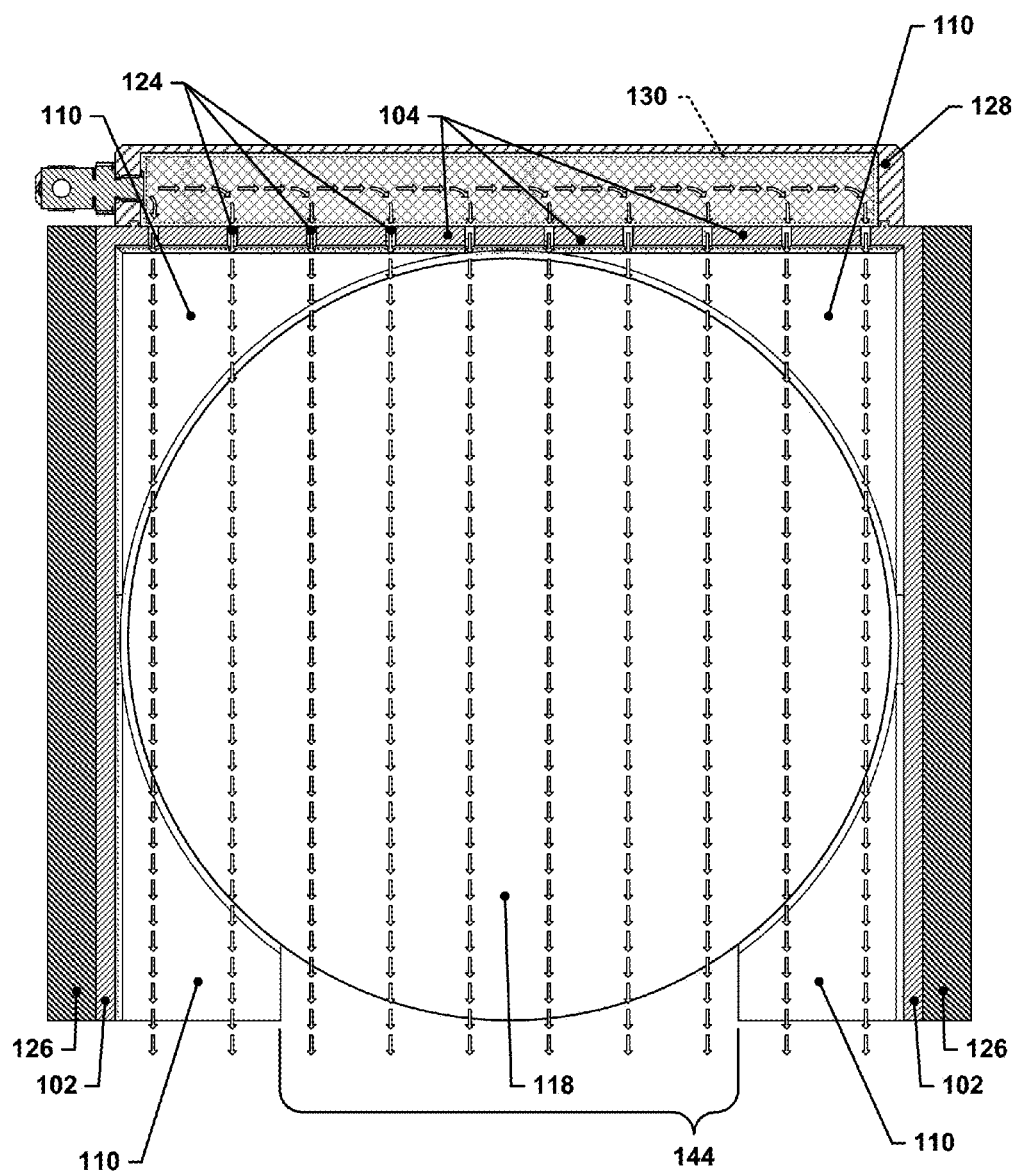
FIG. 6 depicts a plan section view of the buffer of FIG. 1.
Figure 7:
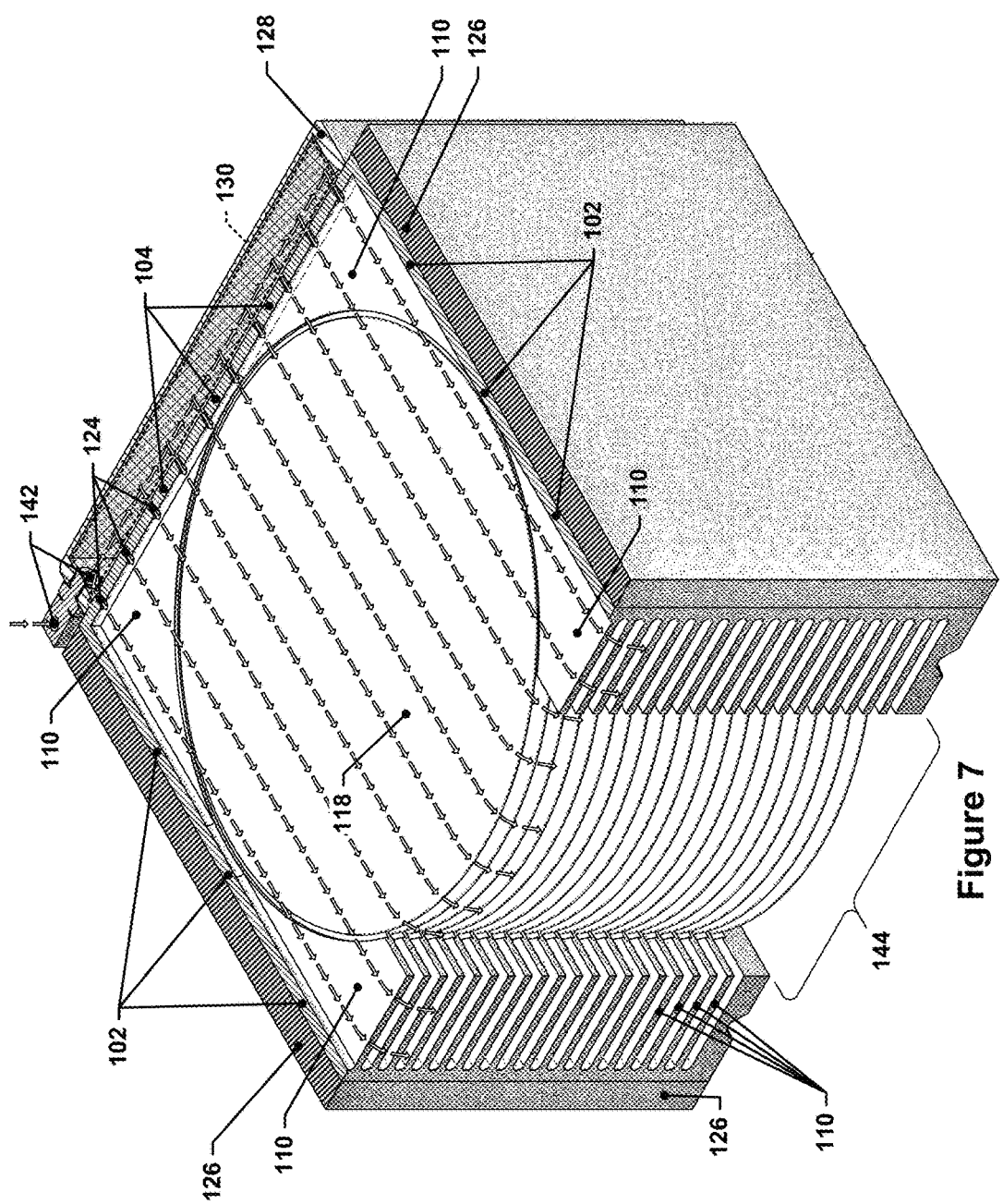
FIG. 7 depicts an isometric plan section view of the buffer of FIG. 1.

FIG. 6 depicts a plan section view of the buffer of FIG. 1. FIG. 7 depicts an isometric plan section view of the buffer of FIG. 1. One of the linear arrays of purge gas ports 124 is clearly visible in FIGS. 6 and 7. In this example, there are 10 purge gas ports 124 arranged in an equally-spaced linear array. However, more or fewer such purge gas ports 124 may be used. In an extreme case, there may be a single purge gas port that extends across most of the back wall 104, e.g., a long, thin slit through which the purge gas may flow.

Figure 8:
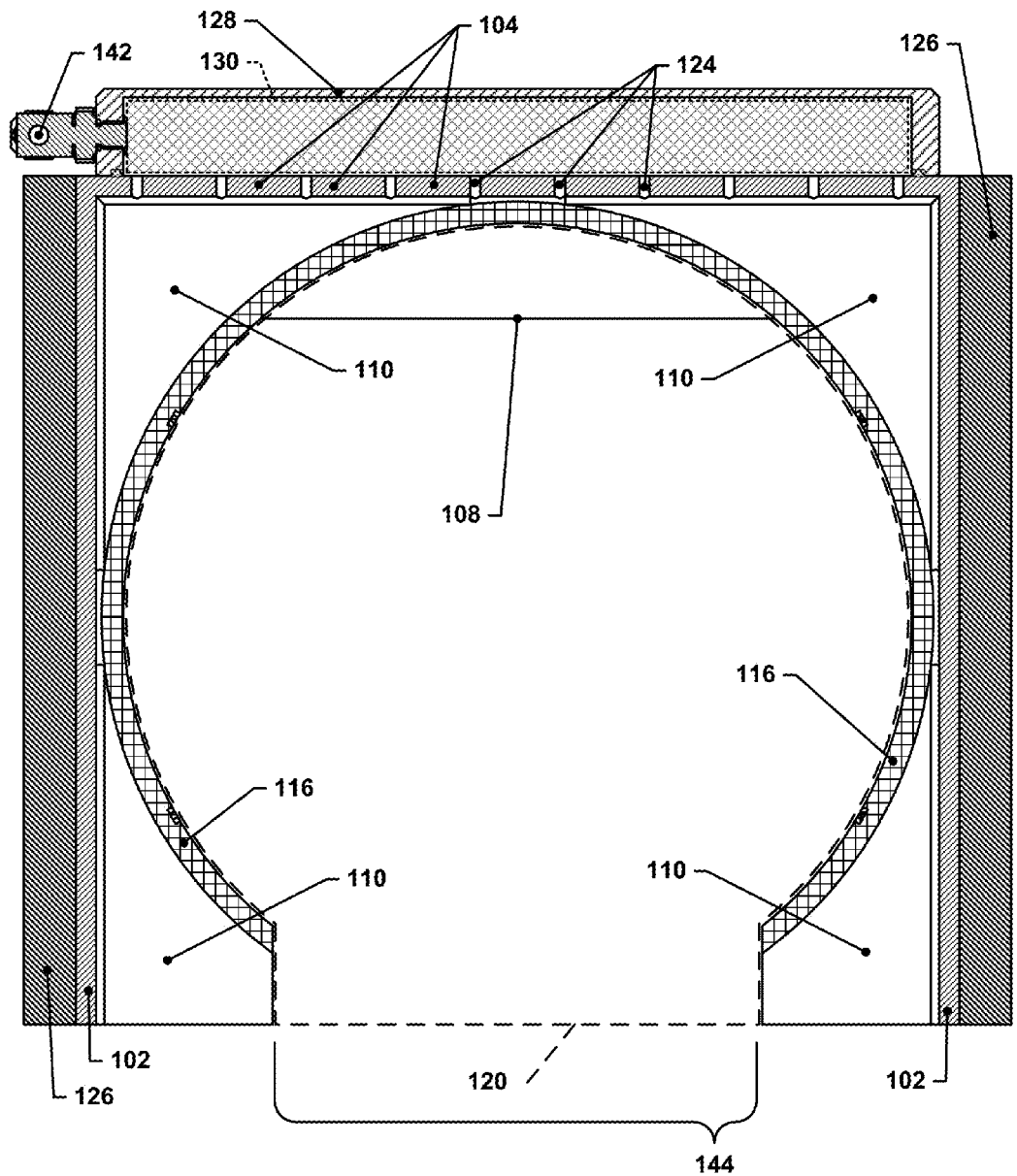
FIG. 8 depicts a plan section view of the buffer of FIG. 1 without any wafers present.
Figure 9:
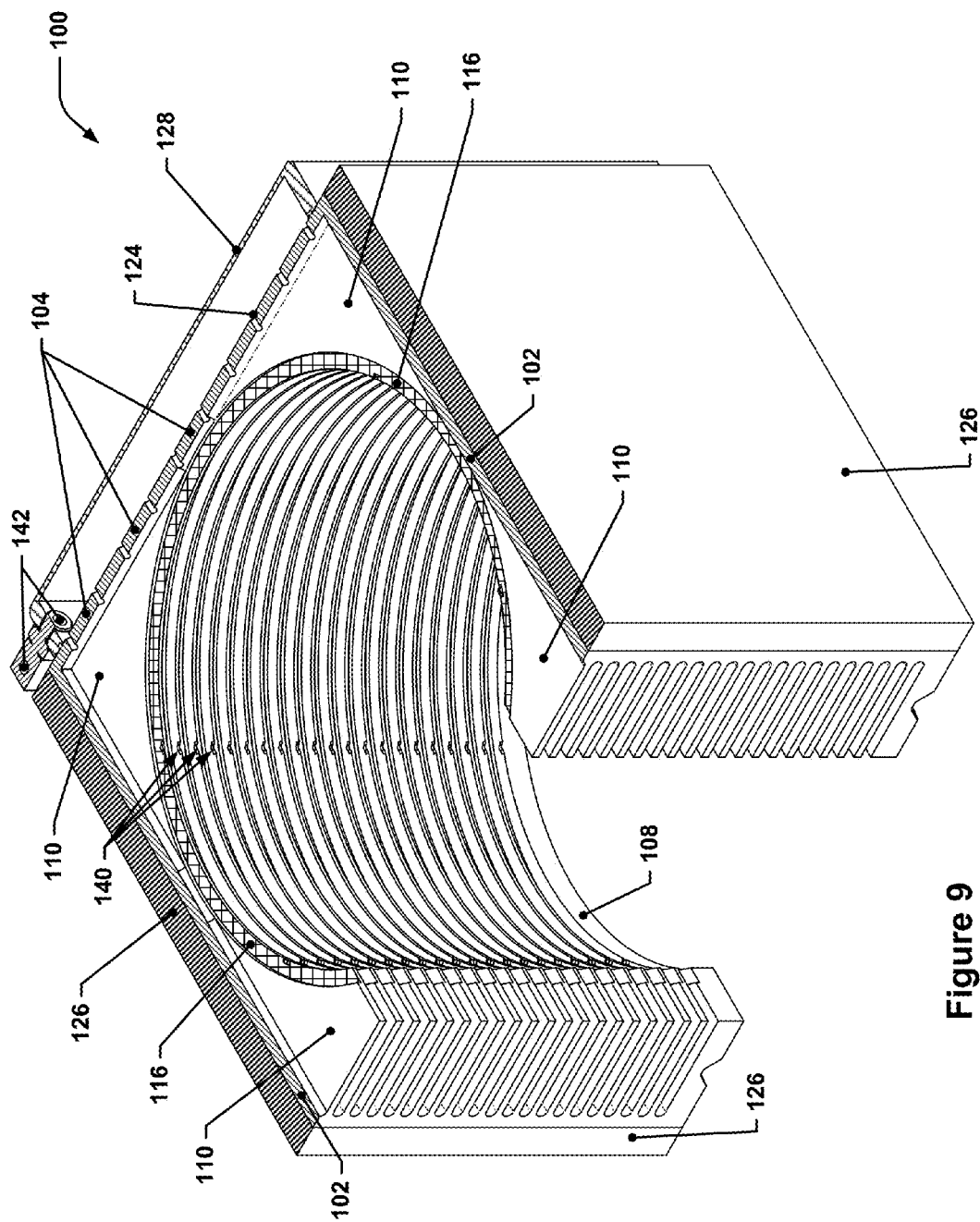
FIG. 9 depicts an isometric plan section view of the buffer of FIG. 1 without any wafers present.

FIG. 8 depicts a plan section view of the buffer of FIG. 1 without any wafers present. FIG. 9 depicts an isometric plan section view of the buffer of FIG. 1 without any wafers present. FIGS. 8 and 9 are included to more clearly depict the wafer support region, which is indicated in these Figures by wafer support region 116. Also shown is cutout region 120, of which cutout region throat 144 forms a part.

While buffers such as the buffer 100 described above may provide a mechanism for protecting wafers 118 from non-inert environments, situating such buffers in a particular manner may provide further protection from contamination. One such particular manner is to situate the buffer in a housing that is configured to cause filtered air to be directed across the opening 114 in a direction generally perpendicular to the wafers 118.

Figure 10:
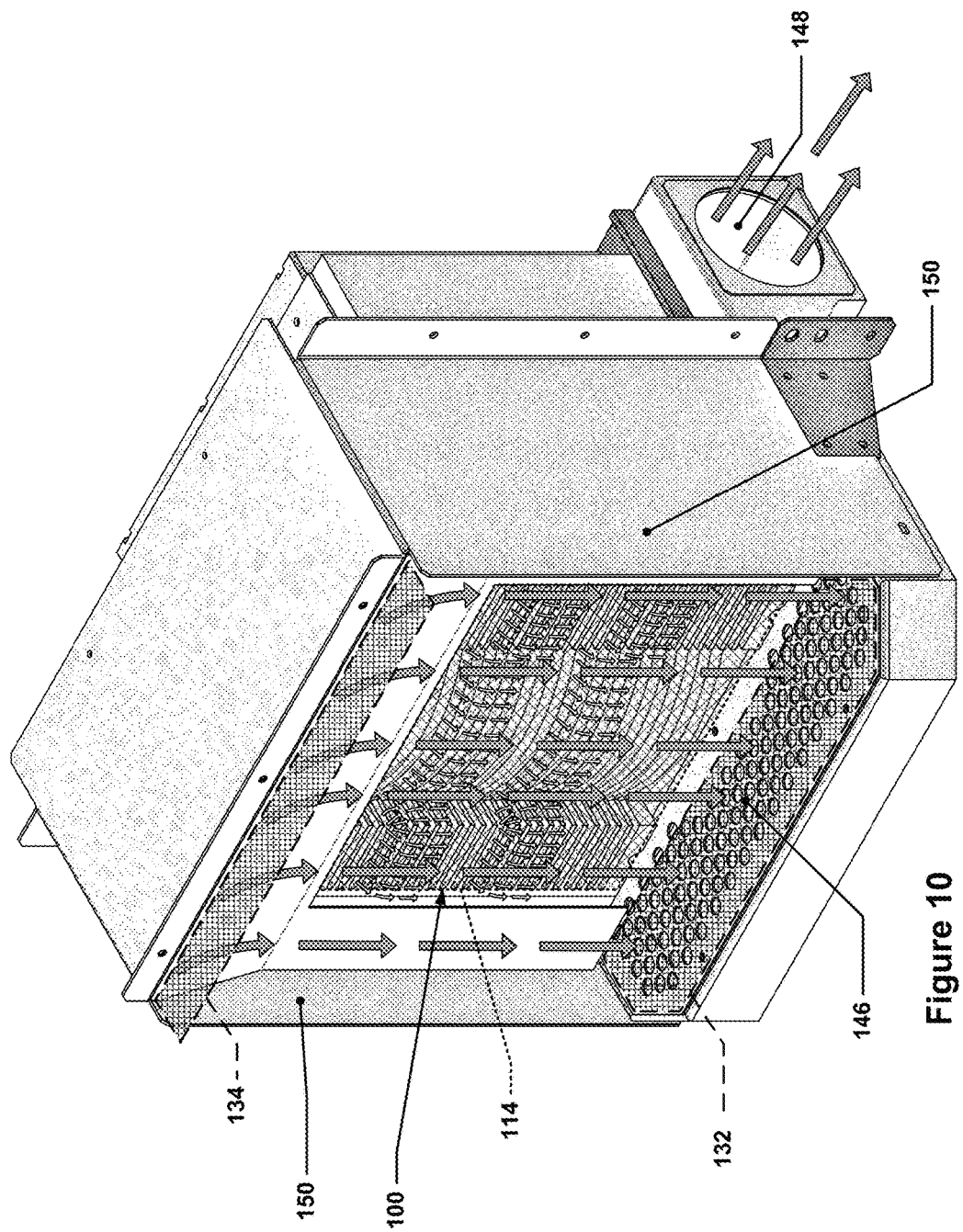
FIG. 10 depicts an isometric view of a buffer installed into a housing that is configured to direct clean air across the front of the buffer.
Figure 11:
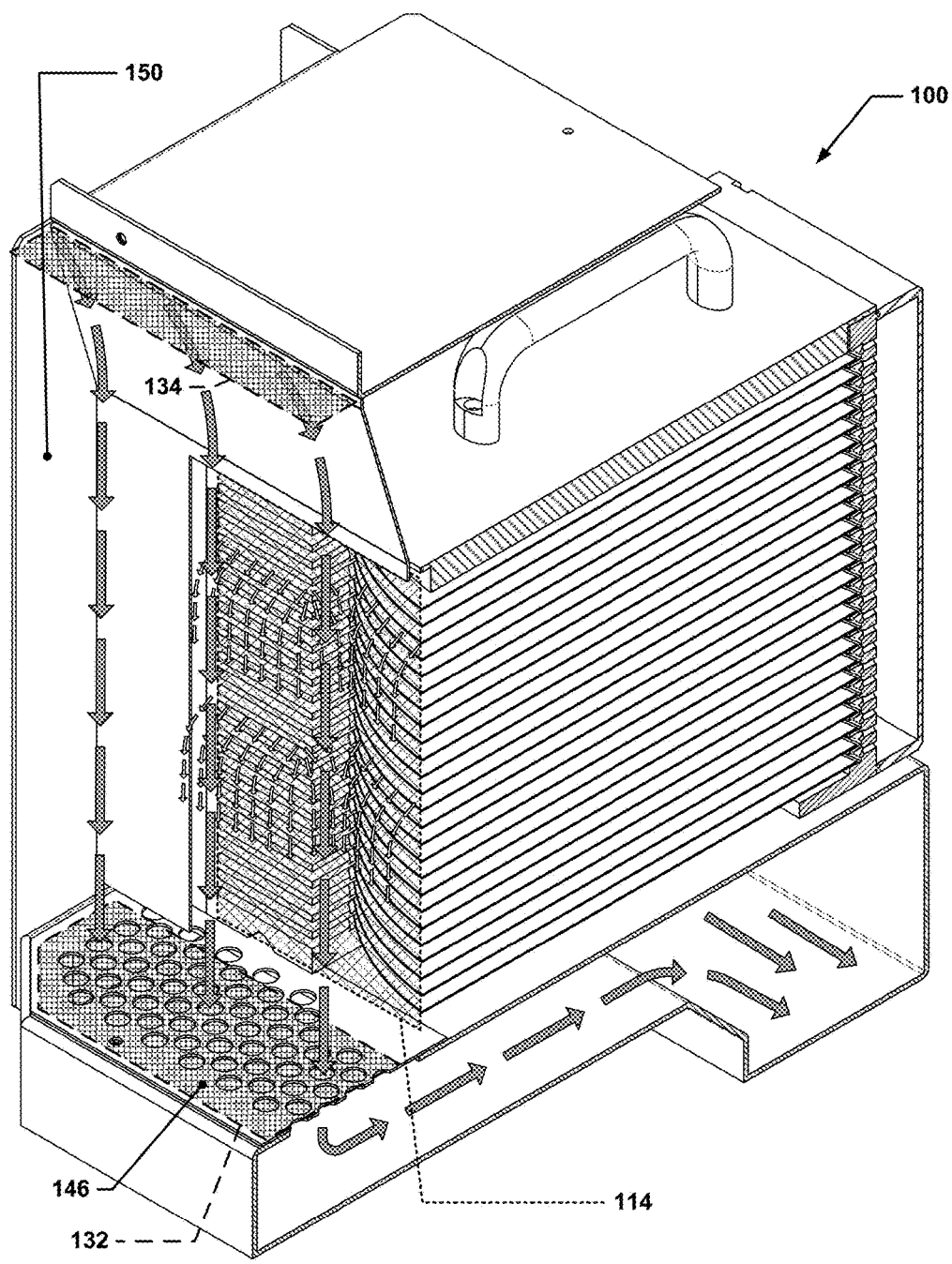
FIG. 11 depicts an isometric section view of the buffer and housing of FIG. 10.
Figure 12:
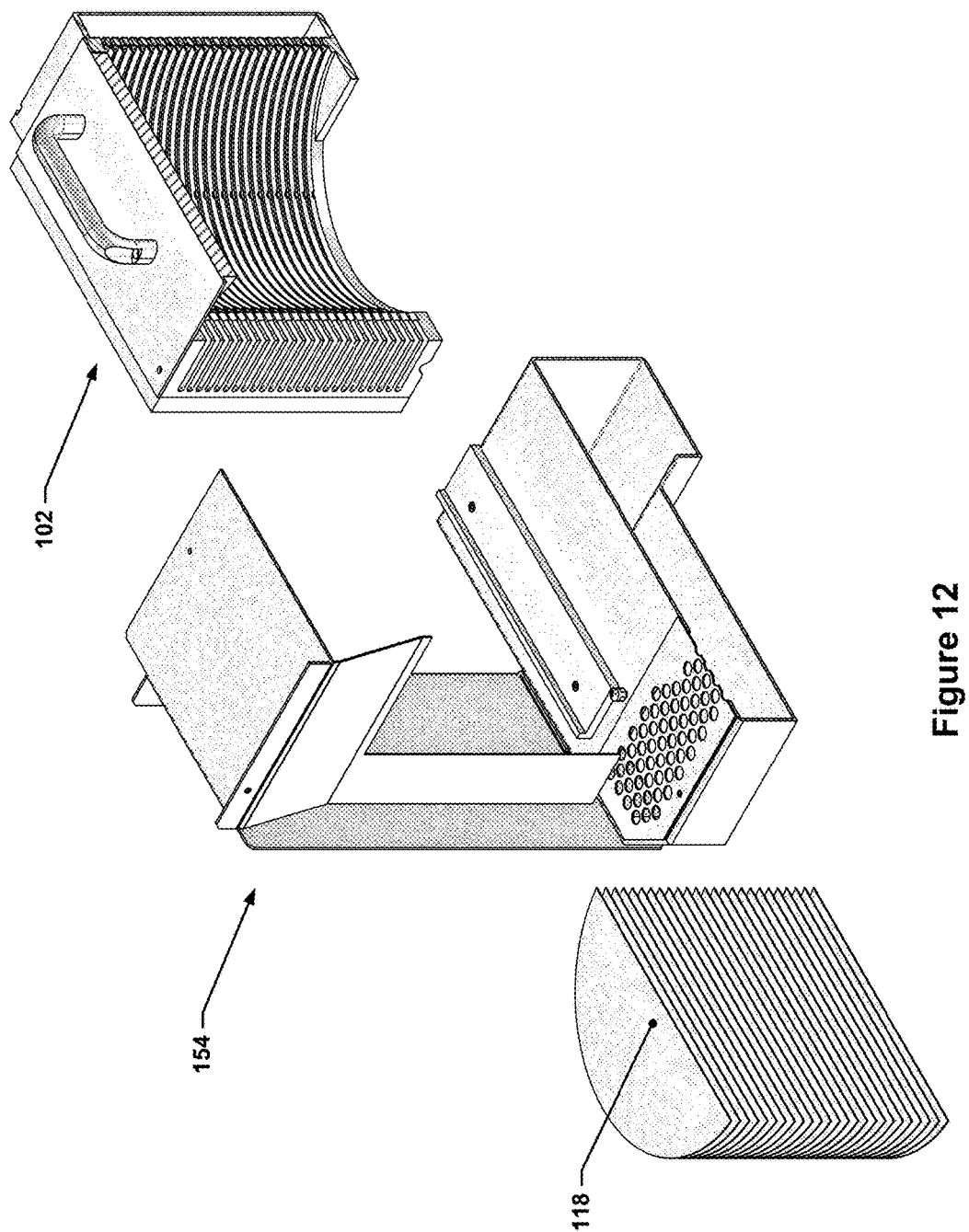
FIG. 12 depicts an isometric exploded section view of the buffer and housing of FIG. 10.

FIG. 10 depicts an isometric view of a buffer installed into a housing that is configured to direct clean air across the front of the buffer. FIG. 11 depicts an isometric section view of the buffer and housing of FIG. 10. FIG. 12 depicts an isometric exploded section view of the buffer and housing of FIG. 10.

Grey arrows have been added to FIGS. 10, 11, and 12 to indicate the flow of filtered air. Such air is typically flowed from vents in the ceiling of an EFEM towards exhaust ports located in the floor of the EFEM. In the case of the housing 154 (see FIG. 12), the housing 154 is shaped to control the flow of filtered air that is supplied from a clean air inlet 134 positioned above the buffer 100 such that the filtered air is prevented from impacting the ceiling or lid 106 of the buffer 100 and is instead routed down the front of the buffer, across the opening 114. Side baffles 150 and front baffles 152 further serve to shape the filtered air flow into a column that flows across the opening 114. This columnar filtered air flow is further encouraged by the addition of an exhaust port 132 located at the base of the opening 114 and extending several inches beyond the front of the buffer 100. The exhaust port 132 may be fluidically connected with an interior plenum of the housing (see section view in FIG. 11); an exhaust grating 146 may be used as a baffle to assist in evening out exhaust flow distribution. The gas that is sucked into the exhaust port 132 may be flowed out of an exhaust vent port 148 that delivers the gas to a scrubber system or other safe disposal system. By including an additional exhaust port directly in front of the buffer, columnar flow of filtered air across the opening is encouraged. Such columnar flow has the effect of sucking the purge gas that flows horizontally off the edge of each "ledge" into a vertical flow column, where it is then evacuated as part of the exhaust stream. This also helps protect the other equipment in the EFEM from contamination by chemicals that are entrained in the purge gas.

FIG. 13 depicts a plan view of an EFEM with two buffers installed. Visible in FIG. 13 is EFEM 156, which is designed to accommodate three FOUPs 158 and which has two buffer units 100, as described herein. A wafer handling robot 160 with an end effector 162 (a single-arm robot is shown, but a multi-arm/multi-end-effector robot or multiple robots may be used as well, however) may be located within the EFEM 156 and used to transport wafers between the FOUPs 158, the buffers 100, and loadlocks 164. The loadlocks 164 may be connected to a transfer chamber or process chamber.

FIG. 14 depicts a top section view of an example buffer similar to the buffer shown in FIG. 1. A buffer 1400 that has a rectangular (in this case, nearly square) cross-sectional profile is shown. The buffer 1400 has a back wall 1404, side walls 1402, and an opening opposite the back wall. A support fin 1410 extends from the back wall 1404 and the side walls 1402 past the exterior diameter of a wafer 1418 (shown using a dashed circle, in this example). In this example, the support fin 1410 extends up to a circular cutout region 1420 with a rectangular cutout region throat 1444. The cutout region throat 1444 is wide enough to allow an end effector 1462 (dotted outline) of a wafer handling robot (not shown) to be inserted into the buffer 1400. A wafer support region 1416 is defined between the outer edge of the cutout region 1420 and a circular boundary around the wafer 1418 and having a diameter at least as large as the wafer 1418.

FIG. 15 depicts a top section view of another example buffer. A buffer 1500 that has a rectangular (in this case, nearly square) cross-sectional profile is shown. The buffer 1500 has a back wall 1504, side walls 1502, and an opening opposite the back wall. A support fin 1510 extends from the back wall 1504 and the side walls 1502 past the exterior diameter of a wafer 1518 (shown using a dashed circle, in this example). In this example, the support fin 1510 extends up to a slot-shaped cutout region 1520 that has a rounded innermost surface (other shapes are also possible, however, depending on the desires of the designer). In this example, the cutout region 1520 has a cutout region throat 1544 that is, in essence, the same width as the cutout region 1520. The cutout region throat 1544 is wide enough to allow an end effector 1562 (dotted outline) of a wafer handling robot (not shown) to be inserted into the buffer 1500. A wafer support region 1516 is defined between the outer edge of the cutout region 1520 and a circular boundary around the wafer 1518 and having a diameter at least as large as the wafer 1518.

FIG. 16 depicts a top section view of yet another example buffer. A buffer 1600 that has a rectangular (in this case, nearly square) cross-sectional profile is shown. The buffer 1600 has a back wall 1604, side walls 1602, and an opening opposite the back wall. A support fin 1610 extends from the back wall 1604 and the side walls 1602 past the exterior diameter of a wafer 1618 (shown using a dashed circle, in this example). In this example, the support fin 1610 extends up to a slot-shaped cutout region 1620 that has a rounded innermost surface (other shapes are also possible, however, depending on the desires of the designer). As with the previous example buffer 1500, the cutout region 1620 has a cutout region throat 1644 that is, in essence, the same width as the cutout region 1620. The cutout region throat 1644 is wide enough to allow an end effector 1662 (dotted outline) of a wafer handling robot (not shown) to be inserted into the buffer 1600. In this example, however, the end effector is wider than in the prior example, and the cutout region throat 1644 is just slightly smaller than the diameter of the wafer 1618. A wafer support region 1616 is defined between the outer edge of the cutout region 1620 and a circular boundary around the wafer 1618 and having a diameter at least as large as the wafer 1618. The wafer support region 1616 only overlaps with just over 50% of the outer perimeter of the wafer 1618, as compared with the wafer support region 1516's overlap with over 75% of the outer perimeter of the wafer 1518, but such a reduced overlap may still provide acceptable performance according to the principles discussed herein.

As discussed previously, while the example buffers discussed above have primarily had rectangular cross-sections in the plan view, buffers with other cross-sectional profiles may also be implemented using the techniques discussed herein.

FIG. 17 depicts a top sectional view of a buffer with a hexagonal cross-section. Such a buffer 1700 may be provided, as illustrated, by chamfering a back wall 1704 such that the back corners of the buffer 1700 are removed (or at least replaced with corners greater than 90 degrees in included angle). Side walls 1702 may, in such designs, only extend a small distance beyond the center of whatever wafers are inserted into the buffer 1700. This may have the effect of reducing the surface area of support fin 1710 (the cutout region 1720, cutout region throat 1744, and wafer support region 1716 are substantially identical, in this case, to the corresponding structures in FIG. 14), and may reduce the amount of dead space that is present in the buffer 1700.

FIG. 18 depicts a top sectional view of a buffer with a cylindrical back wall. Such a buffer 1800 may be provided, as illustrated, by shaping a back wall 1804 such that it is the shape of a half-cylinder. Side walls 1802 may, in such designs, only extend a small distance beyond the center of whatever wafers are inserted into the buffer 1800. Such an implementation may further act to reduce the potential dead space within the buffer 1800 as compared with buffer 1700 (the cutout region 1820, cutout region throat 1844, and wafer support region 1816 are, as with the prior example, substantially identical to the corresponding structures in FIG. 14).

FIGS. 14 through 18 represent only some of the different ways that the concepts and principles discussed herein may be implemented to provide a buffer. It is to be understood that other implementations may depart from the depicted examples but still fall within the scope of this disclosure, and that this disclosure is not to be limited to only the examples provided.

The side walls, back wall, and support fins of buffers designed according to the principles discussed herein may be manufactured in a number of different ways. For example, the side walls, back wall, and support fins may be cast as a single, monolithic part and the purge gas ports and wafer support features may then be machined into the cast part. In another implementation, the side walls, back wall, and support fins may be assembled by stacking together a large number of horizontal cross-sectional pieces, e.g., horizontal cross-sections of the side walls and back wall without the support fins alternating with horizontal cross-sections of the side walls and back wall with the support fins. This may allow the buffer to be expanded or reduced in size without needing to produce an entirely new buffer (further cross-sectional pieces may be added or cross-sectional pieces removed to increase or decrease the number of wafers that may be supported within the buffer). These, and other, manufacturing techniques may be used to construct the side walls, back wall, and support fin structures. The buffer structures may be made of any suitable material, such as, for example, an aluminum alloy. The wafer support features may be provided by small features machined into the support fins, or by small components attached to the support fins, e.g., pins, standoffs, or small, stainless steel balls that are press-fit into holes in the support fins.

FIGS. 19 through 22 depict another example of a buffer embodying the concepts discussed herein. FIG. 19 depicts an exploded isometric view of this second example buffer. FIG. 20 depicts an isometric section view of the example buffer of FIG. 19. FIG. 21 depicts another isometric section view of the example buffer of FIG. 19. FIG. 22 depicts a top section view of the example buffer of FIG. 19.

Visible in FIGS. 19 through 22 is buffer 2100, which has a shape similar to the buffer of FIG. 1700. As can be seen, the buffer 2100 has two side walls 2102 and a back wall 2104 with three segments (one perpendicular to the side walls 2102, and flanking segments at 45 degrees to the side walls 2102), as well as a floor 2108 and a ceiling 2106.

In this implementation, all of the side walls 2102 and back wall 2104 contain plenum cavities 2130, which are capped by plenum covers 2128. Each plenum cavity 2130 has a plurality of purge gas ports 2124; the purge gas ports 2124 are arranged such that purge gas is directed from subsets of the purge gas ports 2124 between each pair of wafers 2118. The wafers 2118 may be supported on pegs 2144 that project radially inward from the interior surface of support fins 2110.

The buffer 2100 is different from the buffer 100 in that there is an exhaust port 2132 located in the floor 2108, rather than in front of the buffer. However, just like in the buffer 100, purge gas that is introduced into the inter-wafer spaces through the purge gas ports 2124 is constrained by the wafers 2118 and the support fins 2110 such that it flows towards the opening 2114 (the opening 2114 is indicated in higher fidelity than the opening 114, which is represented in the simplified form of a plane). This prevents ambient air from the surrounding environment from being drawn into the inter-wafer spaces. The purge gas, after reaching the edge of the wafers closest to the opening 2114, is then drawn downwards (essentially along the opening 2114 boundary) towards the exhaust port 2132. Any residuals from the wafers 2118 that are entrained in the purge gas will thus be drawn into the exhaust port 2132.

As is visible in the detail view FIG. 19', the support fins 2110 in buffer 2100 are of a slightly different design than in buffer 100. In buffer 2100, the cutout region 2120 (see FIG. 22) has a circular portion that is slightly larger in diameter than the wafer 2118, resulting in a small radial gap between the support fins 2110 and the wafer 2118 about the periphery of the wafer 2118. Instead of being supported by resting on the upper surface of the support fin 2110, wafers 2118 may be supported by pegs 2144 that protrude into the cutout region 2120 from the interior surface of the support fins 2110. The pegs 2144 may include a rod portion with an expanded-diameter portion, e.g., a spherical knob, that is designed to contact the wafers 2118. As can be seen, the radial gaps formed between the wafers 2118 and the support fins 2110 offer a less tortuous path than the wafer support region of the support fins 110. However, the bulk of the purge gas flow within the buffer 2100 will still be towards the opening 2114.

In such an implementation, the wafer support region may be viewed as being an annular area that includes the pegs 2144 within its area.

It is also to be understood that the buffers described herein may be combined with various configurations of filtered air and exhaust systems. Furthermore, it is to be understood that the "filtered air" may also be replaced with other gases, e.g., an inert gas (at least, from a wafer chemistry standpoint) such as nitrogen may be supplied via the filtered or clean "air" inlet, forming a curtain of purge gas in front of the buffer opening. Following are a several, non-exhaustive examples of potential filtered air inlet/exhaust port configurations that may be used.

FIG. 23 depicts a front view of a buffer with a side-mounted exhaust and side-mounted filtered air inlet. As can be see, in this configuration, a clean air (or purge gas) curtain flows across buffer 2300 from filtered air inlet 2334 to exhaust port 2332 (left to right); the direction, of course, may also be reversed from the direction shown, if desired. If two buffers 2300 are located adjacent to one another, then the filtered air inlet 2334 may be interposed between them and exhaust ports 2332 may be placed on opposing sides of the buffers 2300, allowing a common filtered air inlet 2334 to provide a gas curtain across two separate buffers 2300.

FIG. 24 depicts a front view of a buffer with bottom-mounted exhaust and a top-mounted filtered air inlet. This implementation, in which filtered air (or purge gas) is flowed from a filtered air inlet 2434 mounted above a buffer 2400 into an exhaust port 2432 mounted below the buffer 2400, corresponds generally with the arrangement shown in FIGS. 10 through 12.

FIG. 25 depicts a front view of a buffer with top-mounted filtered air inlet and side- and bottom-mounted exhausts. Finally, as can be seen in FIG. 25, another configuration that may be used is to have both side- and bottom-mounted exhaust ports 2532 draw air from a top-mounted filtered air inlet 2534. This may prove to provide an even more effective barrier against accidentally drawing EFEM mini-environment air into the buffer 2500.

It is to be understood that the buffers and housings described above may also include other or additional components, e.g., centering/buffer-locating features, temperature sensors, humidity sensors, etc. For example, a buffer such as those described herein may be implemented so as to be easily removable from an EFEM for rapid inspection and cleaning (or replacement), and may have features on the underside of the floor that allow the EFEM to be rapidly positioned with respect to the EFEM.

The use of relative positioning terms such as "above" and "below" within this specification are used in their typical senses. The term "front," when used with respect to the buffer, refers to the portion of the buffer through which wafers are inserted during normal use. The term "back" refers to the portion of the buffer on the opposite side from the front.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. An apparatus for storing multiple wafers in a semiconductor manufacturing tool, the apparatus comprising:
    a buffer that includes two opposing side walls, a back wall; and a plurality of support fins;
    at least one heater platen, the at least one heater platen in thermally-conductive contact with at least one of the opposing side walls;
    an exhaust port; and
    a clean air inlet, wherein:
        the two opposing side walls and the back wall define part of an interior buffer volume;
        the interior buffer volume is partially bounded by an opening opposite the back wall;
        the clean air inlet is configured to flow gas across the opening and into the exhaust port;
        the clean air inlet and the exhaust port are both positioned outside of the interior buffer volume and such that the opening is interposed between the interior buffer volume and the clean air inlet;
        the opposing side walls are between the opening and the back wall; and
        each support fin:
            a) extends from the back wall, along both side walls, and to the opening,
            b) is substantially flat and horizontal when the buffer is in use,
            c) has a wafer support region that is smaller in diameter than the wafers with which the buffer is designed to be used,
            d) extends from the side walls and the back wall in a substantially unbroken manner up to at least the wafer support region, and
            e) has a cutout region that extends from the opening past the center of the wafer support region and that is wide enough in a direction transverse to the opening to allow an end effector of a wafer handling robot to place a wafer on the support fin.

2. The apparatus of claim 1, wherein:
    each support fin is offset from the adjacent support fin or support fins, and
    the support fins form a vertical linear array when the buffer is in use.

3. The apparatus of claim 1, wherein the buffer further includes:
    a ceiling; and
    a floor, wherein:
        the interior buffer volume is further defined by the ceiling and the floor, and
        the back wall and the two opposing side walls are between the ceiling and the floor.

4. The apparatus of claim 3, wherein:
    the opposing side walls, the back wall, the ceiling, and the floor seal the interior buffer volume off from the surrounding environment; and
    the opening is the only substantial flow path out of the interior buffer volume.

5. The apparatus of claim 1, wherein each support fin overlaps over 50% of the outer perimeter of one of the wafers when the wafer is in the wafer support region and supported by the support fin.

6. The apparatus of claim 1, wherein each support fin overlaps over 75% of the outer perimeter of one of the wafers when the wafer is in the wafer support region and supported by the support fin.

7. The apparatus of claim 1, wherein the wafer support region lies within an annular area with an outer diameter larger than the wafer diameter and an inner diameter within 1" of the wafer diameter.

8. The apparatus of claim 1, wherein:
    the wafer support region of each support fin is provided by a recessed area in a surface of the support fin that faces upwards when the buffer is in use; and
    the recessed area of each support fin is recessed to a depth that causes an upper surface of a wafer supported by the support region to be flush with an upper surface of the support fin when the buffer is in use.

9. The apparatus of claim 1, wherein:
    the cutout region has a circular portion of a larger diameter than the wafer,
    each support fin has a plurality of pegs extending from a surface of the support fin facing the center of the circular portion, and the wafer support region is an annular area that includes the pegs within its boundaries.

10. The apparatus of claim 1, wherein the plurality of support fins is selected from the group consisting of: 24 support fins, 25 support fins, 29 support fins, and 30 support fins.

11. The apparatus of claim 1, further comprising at least one additional heater platen, the at least one additional heater platen in thermally-conductive contact with the back wall.

12. The apparatus of claim 1, further comprising a plurality of purge gas ports, wherein there is at least one purge gas port between each pair of adjacent support fins.

13. The apparatus of claim 12, wherein there is a single purge gas port between each pair of adjacent support fins and each purge gas port has the shape of a long, thin slot running in a direction parallel to the adjacent support fins.

14. The apparatus of claim 12, wherein there is a plurality of purge gas ports between each pair of adjacent support fins.

15. The apparatus of claim 14, wherein each plurality of purge gas ports between each pair of adjacent support fins includes a linear array of regularly-spaced purge gas ports.

16. The apparatus of claim 14, wherein the plurality of purge gas ports includes purge gas ports located in the back wall.

17. The apparatus of claim 14, wherein the plurality of purge gas ports includes purge gas ports located in at least one side wall.

18. The apparatus of claim 16, further comprising:
a plenum cover;
a plenum cavity, wherein:
the plenum cavity is defined, at least in part, by the plenum cover and a surface of the back wall opposite the interior buffer volume, and
the plenum cavity is in fluidic communication with the plurality of purge gas ports.

19. An equipment front-end module (EFEM) for a semiconductor processing tool, the EFEM comprising:
an EFEM housing;
one or more loadlocks configured to allow wafers to be transferred from the EFEM to a transfer chamber or process chamber of the semiconductor processing tool;
one or more mechanical interfaces for supporting front-opening unified pods (FOUPs);
a wafer transfer robot configured to transfer wafers between various stations within the EFEM; and
one or more of the apparatuses of claim 1.

20. An apparatus for storing multiple wafers in a semiconductor manufacturing tool, the apparatus comprising:
a buffer that includes two opposing side walls, a back wall, and a plurality of support fins;
at least one heater platen, the at least one heater platen in thermally-conductive contact with at least one of the opposing side walls;
an exhaust port; and
a clean air inlet, wherein:
the two opposing side walls and the back wall define part of an interior buffer volume;
the interior buffer volume is partially bounded by an opening opposite the back wall;
the clean air inlet is configured to flow gas in a first direction across the opening and into the exhaust port and is positioned such that the opening is interposed between the interior buffer volume and the clean air inlet;
the first direction is nominally parallel to the side walls and the back wall;
the opposing side walls are between the opening and the back wall; and
each support fin:
a) extends from the back wall, along both side walls, and to the opening,
b) is substantially flat and horizontal when the buffer is in use,
c) has a wafer support region that is smaller in diameter than the wafers with which the buffer is designed to be used,
d) extends from the side walls and the back wall in a substantially unbroken manner up to at least the wafer support region, and
e) has a cutout region that extends from the opening past the center of the wafer support region and that is wide enough in a direction transverse to the opening to allow an end effector of a wafer handling robot to place a wafer on the support fin.

* * * * *